United States Patent
Saito et al.

(10) Patent No.: US 10,416,556 B2
(45) Date of Patent: Sep. 17, 2019

(54) PHOTOSENSITIVE RESIN COMPOSITION FOR FLEXOGRAPHIC PRINTING AND FLEXOGRAPHIC PRINTING ORIGINAL PLATE

(71) Applicant: ASAHI KASEI KABUSHIKI KAISHA, Tokyo (JP)

(72) Inventors: Hideo Saito, Tokyo (JP); Takafumi Honjo, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 28 days.

(21) Appl. No.: 15/764,130

(22) PCT Filed: Sep. 20, 2016

(86) PCT No.: PCT/JP2016/077653
§ 371 (c)(1),
(2) Date: Mar. 28, 2018

(87) PCT Pub. No.: WO2017/057086
PCT Pub. Date: Apr. 6, 2017

(65) Prior Publication Data
US 2018/0275515 A1 Sep. 27, 2018

(30) Foreign Application Priority Data
Sep. 30, 2015 (JP) ................. 2015-194669

(51) Int. Cl.
*G03F 7/033* (2006.01)
*B41N 1/12* (2006.01)
(Continued)

(52) U.S. Cl.
CPC ............ *G03F 7/033* (2013.01); *B41F 5/24* (2013.01); *B41N 1/12* (2013.01); *G03F 7/027* (2013.01);
(Continued)

(58) Field of Classification Search
None
See application file for complete search history.

(56) References Cited

U.S. PATENT DOCUMENTS 8,492,449 B2 * 7/2013 Inoue ................ G03F 7/032
522/1
2012/0288682 A1 11/2012 Inoue et al.

FOREIGN PATENT DOCUMENTS

JP 2003-107681 A 4/2003
JP 4211141 B2 1/2009
(Continued)

OTHER PUBLICATIONS

International Search Report from Patent Application No. PCT/JP2016/077653, dated Dec. 20, 2016.
International Preliminary Report on Patentability from Patent Application No. PCT/JP2016/077653, dated Apr. 3, 2018.
European Search Report for European patent application No. 16851260.6, dated Oct. 24, 2018.

*Primary Examiner* — Joshua D Zimmerman
(74) *Attorney, Agent, or Firm* — Greenblum & Bernstein, P.L.C.

(57) ABSTRACT

A photosensitive resin composition for flexographic printing, comprising at least (A) a hydrophilic copolymer, (B) an elastomer, (C) a polymerizable unsaturated monomer, and (D) a photopolymerization initiator, wherein, in a cross-section of a cured product of the resin composition, a phase area of a phase comprising the hydrophilic copolymer (A), SA, is 15% or more and 60% or less, and a proportion of the phase having a phase area of 3 μm$^2$ or more and less than 100 μm$^2$ is 20 (% by area) or more of the phase comprising the hydrophilic copolymer (A).

11 Claims, 4 Drawing Sheets

(51) Int. Cl.
*G03F 7/027* (2006.01)
*G03F 7/09* (2006.01)
*B41F 5/24* (2006.01)
*G03F 7/031* (2006.01)
*G03F 7/20* (2006.01)
*G03F 7/32* (2006.01)
*G03F 7/40* (2006.01)

(52) U.S. Cl.
CPC ............... *G03F 7/031* (2013.01); *G03F 7/09* (2013.01); *G03F 7/2004* (2013.01); *G03F 7/2022* (2013.01); *G03F 7/2024* (2013.01); *G03F 7/322* (2013.01); *G03F 7/40* (2013.01)

(56) References Cited

FOREIGN PATENT DOCUMENTS

| | | |
|---|---|---|
| JP | 2011-18079 A | 1/2011 |
| JP | 4627871 B2 | 2/2011 |
| JP | 4994488 B2 | 8/2012 |
| JP | 5325823 B2 | 10/2013 |
| JP | 2015-14685 A | 1/2015 |
| JP | 2015-102641 A | 6/2015 |

\* cited by examiner

PHOTOSENSITIVE RESIN COMPOSITION FOR FLEXOGRAPHIC PRINTING AND FLEXOGRAPHIC PRINTING ORIGINAL PLATE

TECHNICAL FIELD

The present invention relates to a photosensitive resin composition for flexographic printing to be used for a photosensitive layer of a flexographic printing original plate or printing plate and to a flexographic printing original plate using the photosensitive resin composition for flexographic printing.

BACKGROUND ART

Flexographic printing is a kind of letterpress and has an advantage of being applicable to various printing media because a soft material such as rubber or a synthetic resin is used for a printing plate.

With respect to the printing plate used for flexographic printing, there have been a conventional method of making the plate using a negative film and a computer-to-plate technique (hereinafter, CTP technique) in which information processed on a computer is directly drawn on the printing plate to make a relief, and the CTP technique has been becoming the mainstream in recent years.

An original plate of the flexographic printing plate has a different plate configuration between the case where the negative film is used and the case where the CTP technique is used. The case where the negative film is used and the case where the CTP technique is used are common in that a photosensitive layer comprising a photosensitive resin composition is provided on a substrate of a PET resin or the like, but the layers formed on the photosensitive layer are different between the case where the negative film is used and the case where the CTP technique is used. Firstly, when the negative film is used, a transparent image carrier layer for protecting the negative film from the tackiness of the photosensitive layer exists, and the negative film is closely adhered on the transparent image carrier layer before use, the photosensitive layer is irradiated with an ultraviolet ray from above the negative film, and an uncured portion is then removed to form a relief image. On the other hand, when the CTP technique is used, an infrared ablation layer is stacked on the photosensitive layer, an image is directly drawn on the infrared ablation layer with laser or the like, the photosensitive layer is then irradiated with an ultraviolet ray, and an uncured portion is removed to form a relief image.

Recently, the uncured portion may be removed with a developing solution comprising water as the main component (subjected to water development) to form a relief image.

In an aqueous developable photosensitive resin printing original plate for flexographic printing, a photosensitive layer comprising a photosensitive resin composition obtained by mixing a hydrophilic copolymer, a hydrophobic resin such as an elastomer, a polymerizable unsaturated monomer, a photopolymerization initiator, and the like is generally formed on a support for keeping dimensional accuracy.

In the photosensitive resin composition to be used for such a photosensitive layer, it is preferable that each component in the composition be finely and uniformly dispersed in order to obtain a required image faithfully, and it is preferable that the development rate be fast in order to shorten the plate making time. Further, after a plate is made, the plate needs to withstand the use of aqueous inks, the inks adhered to the plate need to be washed off with water, and therefore it is preferable that the water swelling rate after curing be low, and, as a matter of course, the printing durability be high.

As a water developable photosensitive resin composition, for example, a photosensitive resin composition comprising water-dispersed latex, a photopolymerizable monomer, rubber, and a photopolymerization initiator is disclosed in Patent Literature 1.

In addition, the photosensitive resin composition further comprising a sulfonic acid-based surfactant, wherein the rubber forms a dispersed phase having a size of 10 μm or less, is disclosed in Patent Literature 2.

Furthermore, a photosensitive resin composition wherein the water-dispersed latex is synthesized through emulsion polymerization using a reactive emulsifier containing an unsaturated double bond and is internally crosslinked is disclosed in Patent Literature 3.

CITATION LIST

Patent Literature

Patent Literature 1: Japanese Patent No. 4211141
Patent Literature 2: Japanese Patent No. 5325823
Patent Literature 3: Japanese Patent No. 4627871

SUMMARY OF INVENTION

Technical Problem

However, the aqueous developable photosensitive resin composition described in Patent Literatures 1 and 2 has problems that the water resistance of a printing plate using the aqueous developable photosensitive resin composition is low and that the printing durability after adhesion of an ink is lowered.

On the other hand, the aqueous developable photosensitive resin composition described in Patent Literature 3 has a problem that the developability to an aqueous developing solution is low although the water resistance and printing durability of a printing plate are high.

In this way, a good developability to the aqueous developing solution and the water resistance and printing durability after a printing plate is made are required for the photosensitive resin composition to be used for a printing original plate for flexographic printing; however, these are contrary to each other and therefore it is difficult to achieve the two at the same time.

Solution to Problem

The present inventors have conducted diligent studies on such problems to find that when a phase comprising a hydrophilic copolymer (A) is finely dispersed appropriately in a photosensitive resin composition for forming a photosensitive layer of a printing original plate, both the developability to the aqueous developing solution and the water resistance and printing durability of the printing plate can be solved simultaneously and have completed the present invention.

That is, the present invention is as follows.

[1] A photosensitive resin composition for flexographic printing, comprising: at least
(A) a hydrophilic copolymer;
(B) an elastomer;

(C) a polymerizable unsaturated monomer; and (D) a photopolymerization initiator, wherein a proportion (area percentage) of a phase comprising the hydrophilic copolymer (A) in a cross-section of a cured product of the resin composition, $S_A$, is 15% or more and less than 60%, and a proportion of a phase having a phase area of 3 μm² or more and less than 100 μm² in the phase comprising the hydrophilic copolymer (A) in the cross-section is 20 (% by area) or more.

[2] The photosensitive resin composition for flexographic printing according to [1], wherein a ratio of the $S_A$ (% by area) to a mass proportion of the hydrophilic copolymer (A) in the resin composition, $W_A$ (% by mass), $S_A/W_A$, is 1.35 or more.

[3] The photosensitive resin composition for flexographic printing according to [1] or [2], comprising from 50 to 250 parts by mass of the elastomer (B), from 10 to 200 parts by mass of the polymerizable unsaturated monomer (C), and from 0.1 to 50 parts by mass of the photopolymerization initiator (D) each based on 100 parts by mass of the hydrophilic copolymer (A).

[4] The photosensitive resin composition for flexographic printing according to any of [1] to [3], further comprising from 0.1 to 15 parts by mass of at least one compound (E) selected from the group consisting of surfactants and (meth) acrylic acid ester monomers containing a polyalkylene glycol chain.

[5] The photosensitive resin composition for flexographic printing according to any of [1] to [4], further comprising from 1 to 250 parts by mass of a plasticizer component (F) based on 100 parts by mass of the hydrophilic copolymer (A).

[6] The photosensitive resin composition for flexographic printing according to [5], wherein the plasticizer component (F) comprises at least one terminal-modified product of liquid polybutadiene modified by an OH group and/or a carboxyl group.

[7] The photosensitive resin composition for flexographic printing according to any of [1] to [6], wherein the polymerizable unsaturated monomer (C) is contained in the phase comprising at least the hydrophilic copolymer (A).

[8] The photosensitive resin composition for flexographic printing according to any of [1] to [7], wherein the elastomer (B) is a thermoplastic block copolymer.

[9] The photosensitive resin composition for flexographic printing according to any of [1] to [8], wherein the hydrophilic copolymer (A) is an internally crosslinked polymer particle comprising a unit derived from a reactive emulsifier containing an unsaturated double bond.

[10] A method for producing the photosensitive resin composition for flexographic printing according to any of [1] to [9], the method comprising the following steps 1 to 3 in this order:

1. a step of adding at least one compound (E) selected from a group consisting of surfactants and (meth)acrylic acid ester monomers containing a polyalkylene glycol chain and/or a plasticizer component (F) to a hydrophilic copolymer (A)-containing aqueous dispersion liquid;

2. a step of removing water from the hydrophilic copolymer (A)-containing aqueous dispersion liquid; and 3. a step of adding the elastomer (B), the polymerizable unsaturated monomer (C), and the photopolymerization initiator (D) to a mixture obtained in the step 2, the mixture comprising the hydrophilic copolymer (A), and then kneading a resultant mixture.

[11] A flexographic printing original plate comprising a photosensitive layer comprising the photosensitive resin composition for flexographic printing according to any of [1] to [9].

Advantageous Effects of Invention

According to the present invention, an original plate for flexographic printing having a high level of developability to the aqueous developing solution and having excellent ink resistance and printing durability can be obtained.

DESCRIPTION OF EMBODIMENTS

Figure 1:
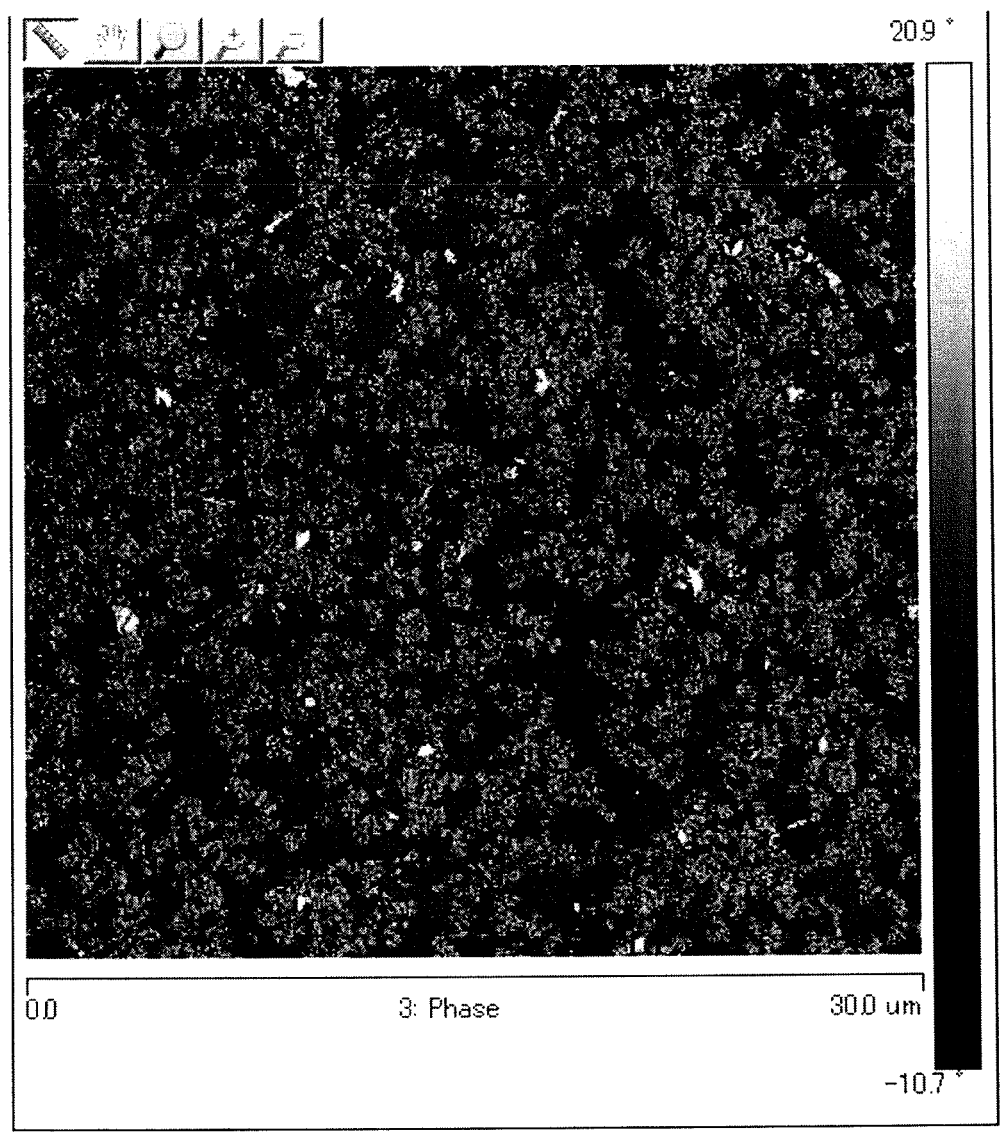
FIG. 1 is an SPM image of a cross-section of a cured product of a photosensitive resin composition for flexographic printing of Example 1.

Hereinafter, an embodiment for carrying out the present invention (hereinafter, referred to as "present embodiment") will be described in detail, but the present invention is not limited to the embodiment, and various modifications can be made within a range not deviating from the scope of the present invention.

In the present embodiment, the photosensitive resin composition for flexographic printing comprises (A) a hydrophilic copolymer, (B) an elastomer, (C) a polymerizable unsaturated monomer, and (D) a photopolymerization initiator and can be used suitably for a photosensitive resin composition layer of a flexographic printing plate to be developed with an aqueous developing solution.

In the present embodiment, the hydrophilic copolymer (A) is an internally crosslinked polymer particle comprising a unit derived from a hydrophilic unsaturated monomer. The amount of the unit derived from the hydrophilic unsaturated monomer may be, for example, 0.1 to 20% by mass, 0.5 to 15% by mass, or 1 to 10% by mass. Examples of such a polymer particle include a product obtained by removing water from water-dispersed latex wherein polymer particles are dispersed as a dispersoid in water, the polymer particles obtained through emulsion polymerization using a hydrophilic unsaturated monomer and, as necessary, another monomer which is copolymerizable with the hydrophilic unsaturated monomer.

As the hydrophilic unsaturated monomer, a monomer containing at least one hydrophilic group and unsaturated double bond is preferable, and examples thereof include a monomer containing an unsaturated double bond containing a carboxylic acid, a sulfonic acid, a phosphoric acid, or a salt or an acid anhydride thereof, a monomer containing a hydroxy group and an unsaturated double bond, a monomer containing acrylamide and an unsaturated double bond, and a surfactant (monomer) containing a reactive unsaturated double bond. These compounds may be used singly, or two or more of these compounds may be used together.

The water-dispersed latex is not particularly limited, and examples thereof include water-dispersed latex polymers such as acrylonitrile-butadiene copolymer latex, polychloroprene latex, polyisoprene latex, polyurethane latex, (meth)acrylate-butadiene latex, vinylpyridine polymer latex, butyl polymer latex, THIOKOL polymer latex, and acrylate polymer latex. Also, products in which a (meth)acrylate or at least one of acidic functional group-containing unsaturated monomers is copolymerized with these kinds of water-dispersed latex are preferable, wherein examples of the acidic functional group includes a monobasic acid such as a carboxylic acid such as acrylic acid, methacrylic acid, crotonic acid, vinylbenzoic acid, or cinnamic acid, or a sulfonic acid such as styrene sulfonic acid; a dibasic acid such as itaconic acid, fumaric acid, maleic acid, citraconic acid, or muconic acid; or the like.

It is to be noted that the water-dispersed latex may further comprise another polymer particle as a dispersoid in addition to the polymer particle obtained through emulsion polymerization using a hydrophilic unsaturated monomer and, as necessary, another monomer which is copolymerizable with the hydrophilic unsaturated monomer. Examples of the another polymer include polybutadiene, natural rubber, and styrene-butadiene copolymers.

Among these, the water-dispersed latex containing a butadiene skeleton or an isoprene skeleton in the molecular chain is preferable from the viewpoint of the printing durability. Specifically, polybutadiene latex, styrene-butadiene copolymer latex, acrylonitrile-butadiene copolymer latex and/or products in which a (meth)acrylic acid ester, acrylic acid, methacrylic acid, itaconic acid or the like is copolymerized therewith are preferable. Further preferable are water-dispersed latex of a copolymer in which at least one of a (meth)acrylic acid ester and an acidic functional group-containing unsaturated monomer such as acrylic acid, methacrylic acid, and itaconic acid is copolymerized with styrene-butadiene copolymer.

It is preferable that the amount of the acidic functional group-containing unsaturated monomer to be used be 1 to 30% by mass of the total amount of the unsaturated monomers to be used for the synthesis of the hydrophilic copolymer (A). When the amount is 1% by mass or more, there is a tendency that the aqueous development becomes easy to perform, and on the other hand, when the amount is 30% by mass or less, deterioration of the processability in mixing of the photosensitive resin composition caused by an increase in the amount of moisture absorbed in the resin composition or an increase in the amount of swelling of ink can be prevented.

As the unsaturated monomer which can be used for the synthesis of the hydrophilic copolymer (A) other than the acidic functional group-containing monomer include conjugated dienes, aromatic vinyl compounds, (meth)acrylic acid esters, ethylene-based monocarboxylic acid ester monomers having a hydroxy group, unsaturated dibasic acid alkyl esters, maleic anhydride, vinyl cyanide compounds, (meth)acrylamide and derivatives thereof, vinyl esters, vinyl ethers, vinyl halides, amino group-containing basic monomers, vinylpyridine, olefins, silicon-containing $\alpha,\beta$-ethylenically unsaturated monomers, and allyl compounds.

More specifically, examples of the conjugated dienes include 1,3-butadiene, isoprene, 2,3-dimethyl 1,3-butadiene, 2-ethyl-1,3-butadiene, 2-methyl-1,3-butadiene, 1,3-pentadiene, chloroprene, 2-chloro-1,3-butadiene, and cyclopentadiene.

Examples of the aromatic vinyl compounds include styrene, $\alpha$-methylstyrene, o-methylstyrene, m-methylstyrene, p-methylstyrene, ethylstyrene, vinyltoluene, vinylxylene, bromostyrene, vinylbenzyl chloride, p-t-butylstyrene, chlorostyrene, alkylstyrenes, divinylbenzene, and trivinylbenzene.

Examples of the (meth)acrylic acid esters include methyl (meth)acrylate, ethyl (meth)acrylate, propyl (meth)acrylate, n-butyl (meth)acrylate, t-butyl (meth)acrylate, isobutyl (meth)acrylate, n-amyl (meth)acrylate, isoamylhexyl (meth)acrylate, octyl (meth)acrylate, nonyl (meth)acrylate, decyl (meth)acrylate, dodecyl (meth)acrylate, octadecyl (meth)acrylate, cyclohexyl (meth)acrylate, phenyl (meth)acrylate, benzyl (meth)acrylate, 2-ethyl-hexyl (meth)acrylate, hydroxyethyl (meth)acrylate, hydroxypropyl (meth)acrylate, hydroxycyclohexyl (meth)acrylate, glycidyl (meth)acrylate, ethylene glycol di(meth)acrylate, ethylene glycol di(meth)acrylate, 1,3-butylene glycol di(meth)acrylate, 1,4-butylene glycol di(meth)acrylate, propylene glycol di(meth)acrylate, 1,5-pentanediol di(meth)acrylate, neopentyl glycol di(meth)acrylate, 1,6-hexanediol di(meth)acrylate, diethylene glycol di(meth)acrylate, triethylene glycol di(meth)acrylate, tetraethylene glycol di(meth)acrylate, polyethylene glycol di(meth)acrylate, polypropylene glycol di(meth)acrylate, pentaerythritol tri(meth)acrylate, trimethylolpropane tri(meth)acrylate, tetramethylolmethane tetra(meth)acrylate, allyl (meth)acrylate, bis(4-acryloxy polyethoxy phenyl)propane, methoxy polyethylene glycol (meth)acrylate, $\beta$-(meth)acryloyloxyethyl hydrogen phthalate, $\beta$-(meth)acryloyloxyethyl hydrogen succinate, 3-chloro-2-hydroxypropyl (meth)acrylate, stearyl (meth)acrylate, phenoxyethyl (meth)acrylate, phenoxy polyethylene glycol (meth)acrylate, 2-hydroxy-1,3-di(meth)acryloxy propane, 2,2-bis[4-((meth)acryloxy ethoxy)phenyl]propane, 2,2-bis[4-((meth)acryloxy-diethoxy)phenyl]propane, 2,2-bis[4-((meth)acryloxy-polyethoxy)phenyl]propane, and isobornyl (meth)acrylate.

Examples of the ethylene-based monocarboxylic acid alkyl ester monomers having a hydroxy group include 2-hydroxyethyl acrylate, 2-hydroxyethyl methacrylate, 2-hydroxypropyl acrylate, 2-hydroxypropyl methacrylate, 1-hydroxypropyl acrylate, 1-hydroxypropyl methacrylate, and hydroxycyclohexyl (meth)acrylate.

Examples of the unsaturated dibasic acid alkyl esters include crotonic acid alkyl esters, itaconic acid alkyl esters, fumaric acid alkyl esters, and maleic acid alkyl esters.

Examples of the vinyl cyanide compounds include acrylonitrile and methacrylonitrile.

Examples of the (meth)acrylamide and the derivatives thereof include (meth)acrylamide, N-methylol (meth)acrylamide, and N-alkoxy (meth)acrylamides.

Examples of the vinyl esters include vinyl acetate, vinyl butyrate, vinyl stearate, vinyl laurate, vinyl myristate, vinyl propionate, and vinyl versatate.

Examples of the vinyl ethers include methyl vinyl ether, ethyl vinyl ether, propyl vinyl ether, butyl vinyl ether, amyl vinyl ether, and hexyl vinyl ether.

Examples of the vinyl halides include vinyl chloride, vinyl bromide, vinyl fluoride, vinylidene chloride, and vinylidene fluoride.

Examples of the amino group-containing basic monomers include aminoethyl (meth)acrylate, dimethylaminoethyl (meth)acrylate, and dietheylaminoethyl (meth)acrylate.

Examples of the olefins include ethylene.

Examples of the silicon-containing $\alpha,\beta$-ethylenically unsaturated monomers include vinyl trichlorosilane and vinyl triethoxysilane.

Examples of the allyl compounds include allyl esters and diallyl phthalate.

Besides, monomers having 3 or more double bonds such as triallyl isocyanurate can also be used.

These monomers may be used singly or in combination of two or more. It is preferable that the mass ratio of the conjugate diene and the other monomers be from 5/95 to 95/5, more preferably from 50/50 to 90/10. The mass ratio exceeding this range may deteriorate the rubber elasticity of the photosensitive resin composition for flexographic printing.

It is preferable that the hydrophilic copolymer (A) is synthesized through emulsion polymerization, and in this case, it is preferable that a reactive emulsifier is used as an emulsifier (surfactant) at the time of polymerization.

It is preferable that the reactive emulsifier is an emulsifier (surfactant): which contains a radically polymerizable double bond, a hydrophilic functional group, and a hydrophobic group in the molecular structure; which has emulsifying, dispersing, and wetting functions similarly to general emulsifiers; and which enables a synthesis of a polymerized product of the hydrophilic copolymer (A) having an average particle diameter of 5 to 500 nm by emulsion polymerization when it is used alone in an amount of 0.1 parts by mass or more based on 100 parts by mass of the unsaturated monomer excluding the reactive emulsifier.

Examples of the structure of the radically polymerizable double bond in a molecular structure include a vinyl group, an acryloyl group, or a methacryloyl group. Examples of the hydrophilic functional group in a molecular structure include: anionic groups such as a sulfonic acid group, a nitric acid group, a phosphoric acid group, a boric acid group, and a carboxyl group; cationic groups such as an amino group; polyoxyalkylene chain structures and the like such as polyoxyethylene, polyoxymethylene, and polyoxypropylene; or a hydroxy group. Examples of the hydrophobic group in a molecular structure include alkyl groups and phenyl groups.

The reactive emulsifier includes an anionic emulsifier, a nonionic emulsifier, a cationic emulsifier, and an amphoteric emulsifier according to the structure type of the hydrophilic functional group contained in the structure. In addition, plural kinds of the radically polymerizable double bonds, the hydrophilic functional groups, and the hydrophobic groups may be contained in a molecular structure.

Examples of the reactive emulsifier that can be used in the present embodiment and generally sold on the market include, but not limited to, anionic surfactants such as ADEKA REASOAP SE (ADEKA CORPORATION), AQUALON HS, BC, and KH (DKS Co., Ltd.), LATEMUL S (Kao Corporation), Antox MS (NIPPON NYUKAZAI CO., LTD.), ADEKA REASOAP SDX and PP (ADEKA CORPORATION), HITENOL A (DKS Co., Ltd.), ELEMINOL RS (Sanyo Chemical Industries, Ltd.), and SPINOMER (Tosoh Corporation), and nonionic surfactants such as AQUALON RN and NOIGEN N (DKS Co., Ltd.), and ADEKA REASOAP NE (ADEKA CORPORATION). These may be used singly or in a combination of two or more.

In the present embodiment, it is preferable that the amount of the reactive emulsifier to be used be in a range of 1 to 20 parts by mass based on 100 parts by mass of the hydrophilic copolymer (A) calculated from the amount of starting materials to be charged. When the amount of the reactive emulsifier is 1 part by mass or more, there is a tendency that the image reproducibility of a printing plate to be obtained is improved, and when the amount is 20 parts by mass or less, there is a tendency that the printing durability of a printing plate to be obtained is improved.

When the hydrophilic copolymer (A) is synthesized through emulsion polymerization in the present embodiment, a nonreactive emulsifier can be used as necessary.

Examples of the nonreactive emulsifier to be used as necessary herein include: anionic surfactants such as fatty acid soap, rosin acid soap, sulfonic acid salts, sulfates, phosphoric acid esters, polyphosphoric acid esters, and acyl sarcosinates, cationic surfactants such as derivatives of nitrilized oils and fats, derivatives of oils and fats, fatty acid derivatives, and α-olefin derivatives; and nonionic surfactants such as alcohol ethoxylates, alkylphenol ethoxylates, propoxylates, aliphatic alkanol amides, alkyl polyglycosides, polyoxyethylene sorbitan fatty acid esters, and oxyethylene-oxypropylene block copolymers. These may be used singly or in a combination of two or more.

Examples of the sulfonic acid salts include alkyl sulfonic acid salts, alky sulfuric acid salts, alkyl sulfosuccinic acid salts, polyoxyethylene alkyl sulfuric acid salts, sulfonated oils and fats, alkyl diphenyl ether disulfonic acid salts, α-olefin sulfonic acid salts, alkyl glyceryl ether sulfonic acid salts, and N-acyl methyl tauric acid salts.

Other examples of these surfactants include surfactants described in "Kaimen Kasseizai Hand Book (Takahashi, Nanba, Koike and Kobayashi: Kogaku Tosyo, 1972)".

It is preferable that the amount of the nonreactive emulsifier to be used be less than 1 part by mass based on 100 parts by mass of the hydrophilic copolymer (A) calculated from the amount of starting materials to be charged. When the amount is less than 1 part by mass, the water swelling rate of the printing plate to be obtained can be in the appropriate range, and the deterioration in the abrasion resistance at the time of the adhesion of an ink and the image reproducibility after moisture absorption can be prevented.

As an emulsion polymerization method for the hydrophilic copolymer (A), it is general to charge a predetermined amount of water, the emulsifier, and other additives in advance in a reaction system the temperature of which is adjusted so that the polymerization can be conducted and then add the polymerization initiator, the unsaturated monomer, the emulsifier, a modifier, and the like into the reaction system by batch operation or by continuous operation. Also, a predetermined amount of seed latex, the initiator, the unsaturated monomer, and other modifiers are generally charged in advance as necessary in the reaction system.

In addition, the stepwise layer structure can be introduced to the hydrophilic copolymer particle to be synthesized by modifying the method of adding the unsaturated monomer, the emulsifier, and other additives and modifiers to the reaction system.

In this case, examples of the physical properties that represent the structures of respective layers include hydrophilicity, a glass transition point, a molecular weight, and crosslinking density. In addition, the number of steps of the layer structure is not particularly limited.

In the present embodiment, a known chain transfer agent can be used in the polymerization for the hydrophilic copolymer (A). Examples of the chain transfer agent include: as sulfur element-containing chain transfer agents, alkane thiols such as t-dodecyl mercaptan and n-dodecyl mercaptan; thioalkyl alcohols such as mercaptoethanol and mercaptopropanol; thioalkyl carboxylic acids such as thioglycolic acid and thiopropionic acid; thiocarboxylic acid alkyl esters such as thioglycolic acid octyl ester and thiopropionic acid octyl ester; and sulfides such as dimethyl sulfide and diethyl sulfide. Besides, examples of the chain transfer agent include halogenated hydrocarbons such as terpinolene, dipentene, t-terpinene, and carbon tetrachloride.

Among these, the alkane thiols exhibit a large chain transfer rate, give a good physical property to polymerized products to be obtained, and therefore are preferable.

These chain transfer agents may be used singly or by mixing two or more. These chain transfer agents are fed to the reaction system in predetermined amounts with the monomer or singly at a predetermined timing. The amount of these chain transfer agents to be used is preferably 0.1 to 10% by mass based on the total amount of the unsaturated monomer to be used in the polymerization for the hydrophilic copolymer (A). When the amount is less than this range, the processability in mixing the photosensitive resin composition may be deteriorated, and when the amount is more than this range, the molecular weight may remarkably become low.

In the present embodiment, a polymerization reaction inhibitor can be used as necessary in the polymerization for the hydrophilic copolymer (A).

The polymerization reaction inhibitor is a compound that lowers the radical polymerization rate when it is added to an emulsion polymerization system. More specifically, the polymerization reaction inhibitor includes a polymerization rate retarder, a chain transfer agent having a low radical restart reactivity, and a monomer having a low radical restart reactivity. The polymerization reaction inhibitor is generally used for adjusting the polymerization reaction rate and adjusting physical properties of latex. These polymerization reaction inhibitors are added to the reaction system by batch operation or by continuous operation. When the polymerization reaction inhibitor is used, the strength of a latex coat is improved and the printing durability is improved. The details on the reaction mechanism are not clear, but it is considered that the polymerization reaction inhibitor is closely involved in the steric structure of a polymer, and it is inferred that the polymerization reaction inhibitor has an effect in adjusting the physical properties of the latex coat due to the involvement.

Examples of the polymerization reaction inhibitor include: quinones such as o-, m-, or p-benzoquinone; nitro compounds such as nitrobenzene and o-, m-, or p-dinitrobenzene; amines such as diphenylamine; catechol derivatives such as tertiary butyl catechol; 1,1-disubstituted vinyl compounds such as 1,1-diphenylethylene or α-methyl styrene, and 2,4-diphenyl-4-methyl-1-pentene; and 1,2-disubstituted vinyl compounds such as 2,4-diphenyl-4-methyl-2-pentene and cyclohexene. Besides, examples of the polymerization reaction inhibitor include compounds described as polymerization inhibitors or polymerization retarders in "POLYMER HANDBOOK 3rd Ed. (J. Brandup, E. H. Immergut: John Wiley & Sons, 1989)" and "Kaitei Kobunshi Gosei No Kagaku (Otsu: Kagaku-Dojin Publishing Company, INC., 1979)". Among these, 2,4-diphenyl-4-methyl-1-penetene (α-methyl styrene dimer) is greatly preferable from the viewpoint of reactivity. These polymerization reaction inhibitors may be used singly or by mixing two or more.

It is preferable that the amount of these polymerization reaction inhibitor to be used be 10% by mass or less based on the total amount of the unsaturated monomers to be used in the polymerization for the hydrophilic copolymer (A). The amount being more than this may lower the polymerization rate remarkably.

The radical polymerization initiator starts addition polymerization of monomers by radical decomposition in the presence of heat or a reducing substance, and any of inorganic initiators and organic initiators can be used.

Examples thereof include water-soluble or oil-soluble peroxodisulfuric acid salts, peroxides, and azobis compounds, and specific examples thereof include potassium peroxodisulfate, sodium peroxodisulfate, ammonium peroxodisulfate, hydrogen peroxide, t-butyl hydroperoxide, benzoyl peroxide, 2,2-azobisbutyronitrile, and cumene hydroperoxide. Besides, examples thereof include compounds described in "POLYMER HANDBOOK 3rd Ed. (written by J. Brandup, E. H. Immergut: published by John Wiley & Sons, 1989)". In addition, a so-called redox polymerization method, where a reducing agent such as acidic sodium sulfite, ascorbic acid or a salt thereof, erythorbic acid or a salt thereof, or rongalite is used in combination with the polymerization initiator, can also be adopted. Among these, the peroxodisulfuric acid salts are particularly suitable as the polymerization initiator. The amount of the polymerization initiator to be used is usually selected from a range of 0.1 to 5.0% by mass, preferably selected from a range of 0.2 to 3.0% by mass based on the mass of the total unsaturated monomers. When the amount is less than this range, the stability during the synthesis of the hydrophilic copolymer may not be obtained, and when the amount is more than this range, the amount of moisture the photosensitive resin composition can absorb may increase.

In the present embodiment, various polymerization modifiers can be added as necessary at the time of synthesizing the hydrophilic copolymer (A). As a pH adjuster, the pH adjuster such as sodium hydroxide, potassium hydroxide, ammonium hydroxide, sodium bicarbonate, sodium carbonate, or disodium hydrogenphosphate can be added. Also, various chelating agents such as disodium ethylenediaminetetraacetate can be added as the polymerization modifier. In addition, with respect to other additives, it is allowable to add various additives including alkali-sensitive latex, a viscosity-reducing agent such as hexametaphosphoric acid, a water-soluble polymer such as polyvinyl alcohol and carboxymethyl cellulose, a thickener, various anti-aging agents, an ultraviolet absorber, an antiseptic agent, a germicide, an antifoaming agent, a dispersant such as sodium polyacrylate, a water-resistant additive, a metal oxide such as zinc oxide, a crosslinking agent such as an isocyanate-based compound and an epoxy compound, a lubricant, a humectant, and the like. The method of adding these additives is not particularly limited, and these additives can be added at any timing of or after the synthesis of the hydrophilic copolymer.

In the present embodiment, the polymerization temperature in the case of conducting the emulsion polymerization for obtaining the hydrophilic copolymer (A) is usually selected from a range of 60 to 120° C.; however, the polymerization may be conducted at a temperature lower than the range by the redox polymerization method or the like. Further, a metal catalyst, such as, for example, a divalent ferrous ion, a trivalent ferric ion, or a copper ion, may be allowed to co-exist as an oxidation-reduction catalyst.

It is preferable that the hydrophilic copolymer (A) be in a particle form, and it is preferable that the average particle diameter of the particles be 500 nm or less, particularly preferably 100 nm or less. When the average particle diameter is too large, the aqueous developability of the printing original plate to be obtained may be lowered.

In addition, it is preferable that the hydrophilic copolymer (A) has a toluene gel fraction of from 60 to 99%. When the gel fraction is below this range, there is a tendency that the strength of the printing plate to be obtained is lowered, and when the gel fraction exceeds this range, there is a tendency that the miscibility of the hydrophilic copolymer (A) and the elastomer (B) is lowered remarkably.

The toluene gel fraction herein refers to a mass fraction (%) determined as follows:

0.5 g of the hydrophilic copolymer (A) obtained by drying a dispersion liquid containing about 30% by mass of the hydrophilic copolymer (A) dripped onto a Teflon sheet at 130° C. for 30 minutes is immersed in 30 ml of toluene at 25° C. The resultant mixture is then shaken using a shaker for 3 hours and is thereafter filtered with a 320 SUS mesh. The fraction which did not pass through the mesh is dried at 130° C. for 1 hour. The mass of the retained fraction after drying is divided by 0.5 (g) to obtain the mass fraction (%) of the toluene gel fraction.

In the present embodiment, (B) the elastomer is an elastomer which exhibits rubber elasticity at normal temperature (25° C.), and examples thereof include thermoplastic block copolymers, polybutadiene, polyacrylonitrile-butadiene, and polyurethane-based elastomers. Among others, the thermoplastic block copolymers are preferable.

As a thermoplastic block copolymer, a product obtained by polymerizing a monovinyl-substituted aromatic hydrocarbon monomer and a conjugated diene monomer is preferable. As the monovinyl-substituted aromatic hydrocarbon monomer, styrene, α-methylstyrene, p-methylstyrene, p-methoxystyrene, and the like can be used, and as the conjugated diene monomer, butadiene, isoprene, and the like can be used.

Specific examples of the thermoplastic block copolymer include styrene-butadiene-styrene block copolymers and styrene-isoprene-styrene copolymers. In a styrene-butadiene-styrene block copolymer or a styrene-isoprene-styrene copolymer herein, a diblock product such as a styrene-butadiene copolymer or a styrene-isoprene copolymer may be mixed. Moreover, the thermoplastic block copolymer may be a product in which styrene is randomly copolymerized wbutadiene or isoprene in a butadiene or isoprene moiety in the styrene-butadiene-styrene block copolymer or the styrene-isoprene-styrene copolymer.

It is preferable that the content of the monovinyl-substituted aromatic hydrocarbon unit in the elastomer (B) herein be in a range of 8 to 50% by mass, since the cold flow of the photosensitive resin composition is suppressed and a good thickness accuracy is achieved when a certain amount of the monovinyl-substituted aromatic hydrocarbon unit is contained, and the hardness of the flexographic printing plate is controlled and a good print quality is obtained when the content of the monovinyl-substituted aromatic hydrocarbon is less than a certain amount.

The vinyl bond unit in the conjugated diene segment of the elastomer (B) contributes to an improvement in reproducibility of a relief but becomes a cause of increasing tackiness at the surface of the flexographic printing plate. From the viewpoint of keeping the balance between both properties, it is preferable that the average percentage of the vinyl bond unit be from 5 to 40 mol %, and a more preferred range is from 10 to 35 mol %.

It is to be noted that the average content of the monovinyl-substituted aromatic hydrocarbon unit and of the conjugated diene unit, and the average percentage of the vinyl bond unit in the conjugated diene segment of the elastomer (B) can be determined from an IR spectrum or by NMR.

It is preferable that the amount of the elastomer (B) be 30 parts by mass or more and less than 250 parts by mass based on 100 parts by mass of the hydrophilic copolymer (A). The amount is more preferably 30 parts by mass or more and less than 200 parts by mass. The amount is still more preferably 50 parts by mass or more and less than 170 parts by mass.

When the amount is less than 30 parts by mass, there is a tendency that the printing durability is lowered, and the swelling rate of a polar ink increases, and when the amount is 250 parts by mass or more, there is a tendency that the developability to an aqueous developing solution is lowered.

Examples of (C) the polymerizable unsaturated monomer for use in the present embodiment include esters of a carboxylic acid such as acrylic acid, methacrylic acid, fumaric acid, and maleic acid, derivatives of acrylamide and methacrylamide, allyl esters, styrene and derivatives thereof, and N-substituted maleimide compounds.

Specific examples thereof include diacrylates and dimethacrylates of an alkane diol such as hexanediol and nonane diol, or diacrylates and dimethacrylates of ethylene glycol, diethylene glycol, propylene glycol, dipropylene glycol, polyethylene glycol, and butylene glycol, or trimethylolpropane triacrylate and trimethacrylate, pentaerythritol tetraacrylate and tetramethacrylate, N,N'-hexamethylene bisacrylamide and methacrylamide, styrene, vinyltoluene, divinylbenzene, diacryl phthalate, triallyl cyanurate, fumaric acid diethyl ester, fumaric acid dibutyl ester, fumaric acid dioctyl ester, fumaric acid distearyl ester, fumaric acid butyl octyl ester, fumaric acid diphenyl ester, fumaric acid dibenzyl ester, maleic acid dibutyl ester, maleic acid dioctyl ester, fumaric acid bis(3-phenylpropyl)ester, fumaric acid dilauryl ester, fumaric acid dibehenyl ester, and N-lauryl maleimide.

These may be used singly or in a combination of two or more.

It is preferable that the content of the polymerizable unsaturated monomer (C) be 10 parts by mass or more and less than 200 parts by mass based on 100 parts by mass of the hydrophilic copolymer (A). The content is more preferably 20 parts by mass or more and less than 150 parts by mass, still more preferably 30 parts by mass or more and less than 100 parts by mass. It is preferable that the content be 10 parts by mass or more because the formability of fine dots and characters is improved. In addition, it is preferable that the content be 200 parts by mass or less because the deformation of an uncured plate during storage and transportation is suppressed and the hardness of the obtained plate becomes appropriate, so that ink deposition on a printing medium having an uneven surface at a solid print portion becomes favorable.

Examples of the photopolymerization initiator (D) for use in the present embodiment include benzophenone, Michler's ketone, benzoin, benzoin methyl ether, benzoin ethyl ether, benzoin isopropyl ether, benzoin isobutyl ether, α-methylol benzoin, α-methylol benzoin methyl ether, α-methoxy benzoin methyl ether, benzoin phenyl ether, α-t-butyl benzoin, 2,2-dimethoxyphenylacetophenone, 2,2-diethoxyphenylacetophenone, benzil, pivaloin, anthraquinone, benzanthraquinone, 2-ethylanthraquinone, and 2-chloroanthraquinone. These may be used singly or in a combination of two or more.

It is preferable that the content of (D) the photopolymerization initiator be 0.1 parts by mass or more and less than 50 parts by mass based on 100 parts by mass of the hydrophilic copolymer (A). The content is more preferably 1 part mass or more and less than 30 parts by mass. It is preferable that the content be 0.1 parts by mass or more because the formability of fine dots and characters is improved. In addition, it is preferable that the content be 50 parts by mass or less because the transmittance of active light such as ultraviolet rays through the photosensitive resin composition can be secured and the exposure sensitivity can be maintained.

In the present embodiment, the photosensitive resin composition can further comprise at least one compound (E) selected from the group consisting of surfactants and (meth) acrylic acid ester monomers containing a polyalkylene glycol chain.

Examples of the surfactants that can be used as the compound (E) in the present embodiment include anionic surfactants, ionic surfactants, nonionic surfactants, anionic reactive surfactants, and nonionic reactive surfactants.

Specific examples thereof include: anionic surfactants such as sodium polyoxyethylene styrenized phenyl ether sulfate, sodium polyoxyalkylene branched decyl ether sulfates, ammonium polyoxyethylene isodecyl ether sulfate, sodium polyoxyethylene tridecyl ether sulfate, sodium polyoxyethylene lauryl ether sulfate, ammonium polyoxyethylene lauryl ether sulfate, sodium polyoxyethylene alkyl ether sulfates, ammonium polyoxyethylene oleyl cetyl ether sulfate, sodium polyoxyethylene oleyl cetyl ether sulfate, polyoxyethylene tridecyl ether phosphate, polyoxyethylene alkyl (C2 to C16) ether phosphate, polyoxyethylene alkyl (C2 to C16) ether phosphate.monoethanolamine salt, sodium alkyl (C2 to C16) phosphate, alkyl (C2 to C16) phosphate.monoethanolamine salt, disodium lauryl sulfosuccinate, disodium lauryl sulfosuccinate, disodium polyoxyethylene alkyl (C2 to C20) sulfosuccinic acid, sodium straight-chain alkylbenzene sulfonates, straight-chain alkylbenzene sulfonic acids, sodium α-olefin sulfonates, phenolsulfonic acid, sodium dioctyl sulfosuccinate, sodium lauryl sulfate, and higher fatty acid potassium salts; ionic surfactants such as alkyl (C8 to C20) trimethylammonium chloride, alkyl (C8 to C20) dimethylethylammonium chloride, didecyldimethylammonium chloride, lauryldimethylbenzylammonium chloride, stearyldimethylhydroxyethylammonium para-toluenesulfonate, stearyl dimethylaminopropyl amide, tributylbenzylammonium chloride, lauryldimethylaminoacetic acid betaine, lauric acid amide propyl betaine, coconut oil fatty acid amide propyl betaine, octanoic acid amide propyl betaine, and lauryldimethylamineoxide; nonionic surfactants such as polyoxyalkylene tridecyl ether, polyoxyethylene isodecyl ether, polyoxyalkylene lauryl ethers, polyoxyalkylene alkyl ethers, mixtures of a polyoxyalkylene ether and a polyether polyol, polyether polyols, polyoxyethylene sulfonated phenyl ether, polyoxyethylene naphthyl ether, phenoxyethanol, polyoxyethylene phenyl ether, polyoxyethylene polyoxypropylene glycol, polyoxyethylene lauryl ether, polyoxyethylene oleyl cetyl ether, polyoxyethylene oleate, polyoxyethylene distearate, polyoxyethylene glyceryl isostearate, polyoxyethylene hardened castor oil, coconut oil fatty acid diethanolamide, polyoxyethylene alkylamines, sorbitan trioleate, sorbitan sesquioleate, sorbitan monooleate, sorbitan monococolate, sorbitan monocaprate, polyoxyethylene sorbitan monococoate, polyoxyethylene sorbitan monostearate, polyoxyethylene sorbitan monooleate, octyl polyglycoside, butyl polyglycoside, sucrose benzoate, sucrose acetate, and sucrose fatty acid esters; anionic reactive surfactants such as ammonium polyoxyethylene-1-(allyloxymethyl)alkyl ether sulfates and ammonium polyoxyethylene nonyl propenyl phenyl ether sulfate; and nonionic reactive surfactants such as polyoxyethylene nonyl propenyl phenyl ether.

In addition, examples of the (meth)acrylic acid ester monomers containing a polyalkylene glycol chain that can be used as the compound (E) in the present embodiment include, as a polyalkylene glycol-containing monomer: polyethylene glycol mono(acrylate), polyethylene glycol di(meth)acrylate each containing ethylene glycol chains in a range of 2 or more and 20 or less; polyethylene glycol mono(meth)acrylate and polypropylene glycol di(meth) acrylate each containing propylene glycol chains in a range of 2 or more and 20 or less; and polyethylene glycol polypropylene glycol di(meth)acrylate, cresyl polyethylene glycol (meth)acrylate, and nonyl phenoxy polyethylene glycol (meth)acrylate each containing polyethylene glycol chains and/or polypropylene glycol chains each in a range of 2 to 20.

The surfactants and the (meth)acrylic acid ester monomers containing a polyalkylene glycol chain each being the compound (E) can be used singly or in a combination of two or more.

Among these compounds (E), the nonionic surfactants, the nonionic reactive surfactants, and the (meth)acrylic acid ester monomers containing a polyalkylene glycol chain are preferable.

It is preferable that the content of the compound (E) be 0.1 parts by mass or more and less than 15 parts by mass based on 100 parts by mass of the hydrophilic copolymer (A). The content is more preferably 0.5 parts by mass or more and less than 10 parts by mass. When the content is less than 0.1 parts by mass, there is a tendency that the developability to an aqueous developing solution becomes low, and when the content is 15 parts by mass or more, there is a tendency that the haze of the obtained resin composition becomes high, the drying time after development becomes long, and the solvent resistance to an aqueous ink is lowered.

In the present embodiment, the photosensitive resin composition may further comprise a plasticizer component (F).

Examples of the plasticizer component (F) include hydrocarbon oil such as naphthenic oil and paraffin oil, a terminal-modified product of liquid polybutadiene, liquid polyisoprene, or liquid polybutadiene, liquid acrylonitrile-butadiene copolymers, a carboxylic acid-modified product of a liquid acrylonitrile-butadiene copolymer, liquid styrene-butadiene copolymers, polystyrene having a number average molecular weight of 2,000 or less, sebacic acid esters, phthalic acid esters, carboxylic acid-modified acrylic polymers.

Among these, liquid butadiene, the terminal-modified product of liquid polybutadiene modified by an OH group, a carboxyl group, or the like, the liquid acrylonitrile-butadiene copolymers, the carboxylic acid-modified product of a liquid acrylonitrile-butadiene copolymer, the liquid styrene-butadiene copolymers, and the carboxylic acid-modified acrylic polymers are preferable.

It is preferable that liquid polybutadiene, the terminal-modified product of liquid polybutadiene, the liquid acrylonitrile-butadiene copolymers, the carboxylic acid-modified product of a liquid acrylonitrile-butadiene copolymer, the liquid styrene-butadiene copolymers, and the carboxylic acid-modified acrylic polymers be used as the plasticizer component (F) because the kneadability and moldability, and the developability are improved, and the plasticizer component (F) is easily mixed with the elastomer (B), thereby improving the printing durability.

It is preferable that the amount of the plasticizer component (F) based on 100 parts by mass of the hydrophilic copolymer (A) be 1 part by mass or more and less than 250 parts by mass, more preferably 10 parts by mass or more and less than 220 parts by mass, and still more preferably 20 parts by mass or more and less than 200 parts by mass. When the amount is less than 1 part by mass, there is a tendency that the curing shrinkage after molding becomes large, and when the amount is 250 parts by mass or more, there is a tendency that the cold flow property becomes deteriorated.

In addition to the essential or arbitrary components described above, various auxiliary additive components such as, for example, a thermal polymerization inhibitor, an ultraviolet absorber, a halation preventing agent, and a light stabilizer can be added if desired in the photosensitive resin composition for flexographic printing according to the present embodiment.

In the present embodiment, the photosensitive resin composition for flexographic printing has a structure in which a phase comprising the hydrophilic copolymer (A) is separated from the other phase, and specifically, at least part of the photosensitive resin composition for flexographic printing preferably has a structure like a so-called sea-island structure in which the phase comprising the hydrophilic copolymer (A) corresponds to the island, and the other phase corresponds to the sea.

In the present embodiment, when a cross-section of a cured product of the photosensitive resin composition for flexographic printing is observed, in the cross-section of the cured product of the resin composition, a proportion (area percentage) of the phase comprising the hydrophilic copolymer (A), $S_A$, is 15% or more and less than 60%, and a proportion of a phase having a phase area of 3 $\mu m^2$ or more and less than 100 $\mu m^2$ in the phase comprising the hydrophilic copolymer (A) is 20 (% by area) or more.

Particularly, when a 30 $\mu m$ square cross-section of the cured product of the photosensitive resin composition is observed, it is preferable that, in the 30 $\mu m$ square cross-section, the proportion (area percentage) of the phase comprising the hydrophilic copolymer (A), $S_A$, is 15% or more and less than 60%, and the proportion of the phase having a phase area of 3 $\mu m^2$ or more and less than 100 $\mu m^2$ in the phase comprising the hydrophilic copolymer (A) is 20 (% by area) or more.

The dispersion state of the phase comprising the hydrophilic copolymer (A) in the photosensitive resin composition can be confirmed by cutting out a thin film slice of the cured product of the photosensitive resin composition and then observing the thin film slice.

It is to be noted that the proportion of the phase having a phase area of 3 $\mu m^2$ or more and less than 100 $\mu m^2$ in the phase comprising the hydrophilic copolymer (A) in the photosensitive resin composition is the same for both the uncured product and the cured product, and the cross-section of the uncured product can also be observed in the same manner as the observation of the cross-section of the cured product; however, it is preferable to observe the cross-section of the cured product because the uncured product in a liquid state may bleed out.

The observation method is not limited, and the observation can be conducted, for example, by transmission electron microscope (TEM) observation, scanning electron microscope (SEM) observation after staining the thin film slice with osmium oxide, phosphotungstic acid, or the like, or observation with a phase mode or the like of a scanning probe microscope (SPM) of an atomic force microscope (AFM). Among others, the measurement with the phase mode or the like of the scanning probe microscope (SPM) of the atomic force microscope (AFM) is preferable because the measurement can be conducted easily by only cutting out the thin film slice from the resin composition without the need for staining the specimen, and by the measurement, the phase comprising the hydrophilic copolymer (A) can be separated easily from the other phase by comparison of the relative hardnesses of respective phases. The SPM measurement can be conducted for both the uncured and cured resin composition, but the relative hardnesses of respective phases may be exchanged with each other due to the polymerization of the polymerizable unsaturated monomer (C) in the curing process. With respect to the resin composition according to the present embodiment, the phase comprising the hydrophilic copolymer (A) is softer than the other phase in the resin composition before curing, but after curing, the situation is reversed such that the phase comprising the hydrophilic copolymer (A) becomes harder than the other phase in the resin composition The proportion (area percentage) of the phase comprising the hydrophilic copolymer (A), $S_A$, and the proportion of the phase having a phase area of 3 $\mu m^2$ or more and less than 100 $\mu m^2$ in the phase comprising the hydrophilic copolymer (A) can be determined specifically in the following manner.

A 30 $\mu m$ by 30 $\mu m$ square (30 $\mu m$ square) image is obtained by the observation with the SPM phase mode of the atomic force microscope. The phase comprising the hydrophilic copolymer (A) are separated from the other phase (phase comprising elastomer (B)) in the obtained image by performing image processing (binarization) based on the phase difference that shows information on the relative hardness to determine the area for each phase comprising the hydrophilic copolymer (A). From the total thereof (total area of phases comprising hydrophilic copolymer (A)), the proportion (area percentage) of the phase comprising the hydrophilic copolymer (A), $S_A$ (% by area), in the cross-section of the cured product of the resin composition is determined (specifically, area percentage of the total area to the observation area (900 $\mu m^2$)).

In addition, a histogram is made from the area of each phase comprising the hydrophilic copolymer (A) (for example, histogram in increments of 1 $\mu m^2$ having a starting value of 0 $\mu m^2$). The proportion (%) of the sum of each phase area of the phase having a phase area of 3 $\mu m^2$ or more and less than 100 $\mu m^2$ to the total area of the phase comprising the hydrophilic copolymer (A) can be obtained from this histogram.

In the present embodiment, it is preferable that the proportion (area percentage) of the phase comprising the hydrophilic copolymer (A), $S_A$, be 15% or more and less than 60%, more preferably 25% or more and 55% or less, and still more preferably 25% or more and 50% or less in the cross-section of the cured product and the uncured product of the photosensitive resin composition for flexographic printing.

When the proportion (area percentage) of the phase comprising the hydrophilic copolymer (A), $S_A$, is less than 15%, there is a tendency the development rate to an aqueous developing solution becomes slow, and when the proportion is 60% or more, there is a tendency that the printing durability is lowered.

In the present embodiment, the proportion of the phase having a phase area of 3 $\mu m^2$ or more and less than 100 $\mu m^2$ in the phase comprising the hydrophilic copolymer (A), which is obtained through the measurement and image processing by the method described above, is 20 (% by area) or more, preferably 30 (% by area) or more, more preferably 40 (% by area) or more, and still more preferably 50 (% by area) or more.

It has been proven by the studies conducted by the present inventors that when the proportion of the phase having a phase area of 3 $\mu m^2$ or more and less than 100 $\mu m^2$ in the phase comprising the hydrophilic copolymer (A) is in the range, the phase comprising the hydrophilic copolymer (A) and the phase comprising the elastomer (B) are mixed well and as a result, the developability to an aqueous developing solution can be improved while the printing durability and the plate properties are maintained at a high level.

It is considered that the reason that the developability to an aqueous developing solution can be improved when the proportion of the phase having a phase area of 3 μm² or more and less than 100 μm² is high is that when the phase comprising the hydrophilic copolymer (A) is small, the interface between the phase comprising the hydrophilic copolymer (A) and the other phase, which can be a starting point of the development, increases. However, when the phase comprising the hydrophilic copolymer (A) is too small, the developability is lowered. The reason for this is not clear; however, it is considered that, while aqueous development proceeds by scraping-off of the phase comprising the hydrophilic copolymer (A) by mechanical means such as a brush or the like, when the phase comprising the hydrophilic copolymer (A) is too small, an edge to be caught by the brush or the like is small, and as a result, the developability is lowered.

On the other hand, when the phases comprising the hydrophilic copolymer (A), which are inferior in abrasion resistance to the other phase, are too large, the scraping-off with a brush or the like becomes easy to perform, but abrasion or chipping easily occurs and, as a result, the printing durability is lowered.

However, the mechanism of the effects of the present invention is not limited to the above.

In the present embodiment, it is preferable that a ratio of the proportion (area percentage) of the phase comprising the hydrophilic copolymer (A) in the cross-section of the cured product of the resin composition, $S_A$ (% by area), to the mass proportion of the hydrophilic copolymer (A) in the resin composition, $W_A$ (% by mass), $S_A/W_A$, is 1.35 or more.

The mass proportion of the hydrophilic copolymer (A) in the resin composition, $W_A$, represents the proportion (% by mass) of the mass of the hydrophilic copolymer (A) based on the mass of the resin composition. It is preferable that the $S_A/W_A$ is 1.35 or more, more preferably 1.40 or more, and still more preferably 1.50 or more. When the $S_A/W_A$ is 1.35 or more, the developability to an aqueous developing solution can be improved.

In the present embodiment, it is preferable that the polymerizable unsaturated monomer (C) is contained in the phase comprising the hydrophilic copolymer (A) of the photosensitive resin composition for flexographic printing. Since the hydrophilic copolymer (A) is a polymer particle, when the polymerizable unsaturated monomer (C) is contained in the phase comprising the hydrophilic copolymer (A), the polymerizable unsaturated monomer (C) connects the polymer particles of the hydrophilic copolymer (A) and, as a result, the print durability of a plate after making the plate can be enhanced.

Whether the polymerizable unsaturated monomer (C) is contained in the phase comprising the hydrophilic copolymer (A) can be confirmed by the analysis with the SPM (phase mode). More specifically, in the SPM (phase mode) analysis, the phase comprising the hydrophilic copolymer (A) is observed as a phase that is softer than the phase comprising the elastomer (B) before curing, but the phase comprising the hydrophilic copolymer (A) is observed as a phase that is harder than the phase comprising the elastomer (B) after photo-curing.

In the present embodiment, the method for producing the photosensitive resin composition for flexographic printing is not particularly limited.

When the hydrophilic copolymer (A) is obtained in the form of aqueous dispersion liquid (latex), it is preferable to use the hydrophilic copolymer (A) after removing water by various methods. For example, the hydrophilic copolymer (A) is flocculated using a flocculant such as a sulfonic acid salt, a nitric acid salt, a hydrochloric acid salt, a carbonic acid salt, and a carboxylic acid salt, a certain level of water is then removed from the hydrophilic copolymer (A)-containing aqueous dispersion liquid through a dehydration step such as centrifugal separation, and thereafter the resultant liquid may be dried after being mixed with the plasticizer component (F), the compound (E) being the surfactant or the like, a stabilizer, and the like as necessary, or the water may be removed from the hydrophilic copolymer (A)-containing aqueous dispersion liquid through distillation or the like after adding the plasticizer component (F), the compound (E) being the surfactant or the like, the stabilizer, and the like as necessary to the hydrophilic copolymer (A)-containing aqueous dispersion liquid.

It is preferable to remove water through distillation or the like after adding the plasticizer component (F), the compound (E) being the surfactant or the like, the stabilizer, and the like to the hydrophilic copolymer (A)-containing aqueous dispersion liquid, since the plasticizer component (F), the compound (E) being the surfactant or the like, the stabilizer, and the like can be dispersed uniformly in the hydrophilic copolymer (A), and the printing plate to be obtained does not cause unevenness in terms of physical properties in image formation.

As the method of removing water through distillation or the like, a batch type drier such as a kneader, a Nauta mixer, or RIBOCONE may be used, or a continuous type dryer such as a devolatilizing extruder, a thin-film distillation machine, a CD drier, a KRC kneader, or an SC processor may be used.

After a dried product of the hydrophilic copolymer (A) or a dried product of the mixture of the hydrophilic copolymer (A) and at least one of the plasticizing component (F), the compound (E) being the surfactant or the like, the stabilizer, and the like which are added as necessary is obtained in this way, the photosensitive resin composition can be prepared by kneading the dried product together with the elastomer (B), the polymerizable unsaturated monomer (C), and the photopolymerization initiator (D) using various conventionally known kneading apparatuses such as an extruder, a banbury mixer, and a kneader.

In the present embodiment, to make the proportion of the phase having a phase area of 3 μm² or more and less than 100 μm² in the phase comprising the hydrophilic copolymer (A) to be 20 (% by area) or more in the cross-section of the cured and uncured product of the photosensitive resin composition for flexographic printing, it is preferable to control the dispersion state of the phase comprising the hydrophilic copolymer (A), for example: by adjusting the kneading conditions during kneading of the resin composition (by controlling a screw pattern or the number of revolutions of a screw when the extruder is used during kneading of the resin composition, or by controlling the number of revolutions or the kneading time when the batch type kneader is used); by adding the compound (E) and the plasticizing component (F) to the hydrophilic copolymer (A) in advance and then mixing the resultant mixture with the other components; or, further by controlling the amount of water contained in the hydrophilic copolymer (A) when the hydrophilic copolymer (A) is supplied in the form of an aqueous dispersion liquid.

In the present embodiment, particularly, it is preferable to obtain the photosensitive resin composition for flexographic printing by a method comprising the following steps 1 to 3 in this order.
1. a step of adding at least one compound (E) selected from the group consisting of surfactants and (meth)acrylic acid ester monomers containing a polyalkylene glycol chain and/or a plasticizer component (F) to a hydrophilic copolymer (A)-containing aqueous dispersion liquid,
2. a step of removing water from the hydrophilic copolymer (A)-containing aqueous dispersion liquid, and
3. a step of adding the elastomer (B), the polymerizable unsaturated monomer (C), and the photopolymerization initiator (D) to a mixture obtained in the step 2, the mixture comprising the hydrophilic copolymer (A), and then kneading a resultant mixture.

In the present embodiment, a flexographic printing original plate comprises at least a photosensitive layer consisting of or comprising the photosensitive resin composition according to the present invention. The photosensitive layer can be formed, for example, by molding the photosensitive resin composition into a layer having a desired thickness through hot-press molding, calendaring treatment, extrusion molding, or the like.

The flexographic printing original plate may be a layered product comprising the photosensitive layer provided on a support such as polyester to maintain the accuracy as a printing plate.

In addition, on the surface of the photosensitive layer opposite to the support, an infrared ablation layer that enables direct drawing on the photosensitive layer may be provided, or an aqueous-developable flexible film layer (also referred to as a transparent image carrier layer or anti-adhesion layer) may be provided in order to improve contact with a negative film and to enable reuse of the negative film.

The support and the infrared ablation layer or the flexible film layer can be closely adhered to the photosensitive layer by molding the photosensitive layer into a sheet form and then performing roll lamination. Also, the surface accuracy of the photosensitive layer can be improved by further performing heating press after the lamination.

In the present embodiment, examples of active-ray sources used for photo-curing (forming latent image) the photosensitive layer of the flexographic printing original plate include a low-pressure mercury lamp, a high-pressure mercury lamp, an ultraviolet ray fluorescent lamp, a carbon arc lamp, a xenon lamp, a zirconium lamp, and sunlight.

In the present embodiment, the photosensitive layer is irradiated with light through the infrared ablation layer or the transparent image carrier after drawing to form a latent image, and then an unirradiated portion is removed (developed) using an aqueous developing solution to obtain a relief (printing plate).

The aqueous developing solution is a developing solution comprising water as the main component and it may be water alone or, for example, a product obtained by blending a surfactant such as a nonionic surfactant or an anionic surfactant, and a pH adjuster, a washing accelerator, and the like as necessary in water.

Specific examples of the nonionic surfactant include polyoxyalkylene alkyl or alkenyl ethers, polyoxyalkylene alkyl or alkenyl phenyl ethers, polyoxyalkylene alkyl or alkenyl amines, polyoxyalkylene alkyl or alkenyl amides, and ethylene oxide/propylene oxide block adducts.

Specific examples of the anionic surfactant include straight-chain alkylbenzene sulfonic acid salts containing an alkyl having an average number of carbon atoms of 8 to 16, α-olefin sulfonic acid salts having an average number of carbon atoms of 10 to 20, dialkyl sulfosuccinic acid salts having an alkyl group or an alkenyl group having 4 to 10 carbon atoms, sulfonic acid salts of a fatty acid lower alkyl ester, alkyl sulfonic acid salts having an average number of carbon atoms of 10 to 20, alkyl ether sulfuric acid salts containing a straight-chain or branched-chain alkyl group or an alkenyl group having an average number of carbon atoms of 10 to 20 and containing 0.5 to 8 mol of ethylene oxide added in average, and saturated or unsaturated fatty acid salts having an average number of carbon atoms of 10 to 22.

In addition, examples of the pH adjuster include sodium borate, sodium carbonate, sodium silicate, sodium metasilicate, sodium succinate, and sodium acetate. Sodium silicate easily dissolves in water and therefore is preferable.

Further, an auxiliary washing agent may be added to the developing solution. The auxiliary washing agent is used together with the surfactant or the pH adjuster to enhance the washing (developing) ability of the developing solution. Specific examples thereof include amines such as monoethanolamine, diethanolamine, and triethanolamine, ammonium salts such as tetramethylammonium hydroxide, and paraffin-based hydrocarbons.

These can be used, for example, by being added to and mixed with the developing solution in a range of 0.1 to 50% by mass, preferably 1 to 10% by mass.

When development is performed, supplementally, vibration may be given to the printing original plate with ultrasonic waves or the like, or the surface of the printing original plate may be rubbed using mechanical means such as a brush.

It is preferable that the printing plate after development be dried in an oven, for example, at 50° C. for 15 to 120 minutes.

Stickiness may be left on the plate surface even after the drying is completed depending on the composition of the photosensitive layer comprising the photosensitive resin composition according to the present embodiment. In that case, the stickiness can be removed by a conventionally known surface treatment method. As such a surface treatment method, an exposure with an active ray having a wavelength of 300 nm or less is desirable.

EXAMPLES

Hereinafter, the present invention will be described by Examples in more specifically, but the present invention is not limited to these Examples.

Production Example 1: Synthesis of Hydrophilic Copolymer (A)-Containing Mixture Comprising Plasticizer Component (F), for Use in Examples 1 to 8 and 10, and Comparative Examples 1 to 2

A pressure-resistant reaction vessel equipped with a stirrer and a jacket for temperature control was initially charged with 125 parts by mass of water and 2 parts by mass of "ADEKA REASOAP" (manufactured by ADEKA CORPORATION), which is an ammonia salt of (α-sulfo(1-nonylphenoxy)methyl-2-(2-propenyloxy)ethoxy-poly(oxy-1,2-ethanediyl) as a reactive emulsifier, the internal temperature of the pressure-resistant reaction vessel was elevated to 80° C., and an oily mixed liquid containing: a monomer mixture containing 10 parts by mass of styrene, 60 parts by mass of butadiene, 23 parts by mass of butyl acrylate, 5 parts by mass of methacrylic acid, and 2 parts by mass of acrylic acid; and 2 parts by mass of t-dodecyl mercaptan, and an aqueous solution containing 28 parts by mass of water, 1.2 parts by mass of sodium peroxodisulfate, 0.2 parts by mass of sodium hydroxide, and 2 parts by mass of the ammonium salt of (α-sulfo(1-nonylphenoxy)methyl-2-(2-propenyloxy) ethoxy-poly(oxy-1,2-ethanediyl) were added at a fixed flow rate over 5 hours and 6 hours, respectively.

Subsequently, the temperature of 80° C. was maintained for 1 hour to complete the polymerization reaction, and then the reaction liquid was cooled. Further, the pH of the produced copolymer latex was adjusted to 7 with sodium hydroxide, unreacted monomers were then removed by a stream stripping method, and the resultant liquid was filtrated with a wire mesh of 200-mesh, and the solid concentration of the filtrate was finally adjusted to 40% by mass to obtain an aqueous dispersion liquid of the hydrophilic copolymer (A).

The aqueous dispersion liquid of the hydrophilic copolymer (A) was dried at 80° C. under reduced pressure while 10 parts by mass of liquid polybutadiene [LBR 352: manufactured by KURARAY CO., LTD.] as the plasticizer component (F) was mixed based on 100 parts by mass of the hydrophilic copolymer (A) contained in the aqueous dispersion liquid to obtain a dried mixture of the hydrophilic component (A) and the plasticizer component (F).

Production Example 2: Synthesis of Hydrophilic Copolymer (A)-Containing Mixture Comprising Plasticizer Component (F), for Use in Example 9

An aqueous dispersion liquid of the hydrophilic copolymer (A) for use in Example 9 was obtained in the same manner as in Production Example 1 except that sodium dodecylbenzenesulfonate being the nonreactive emulsifier was used in place of the reactive emulsifier. A dried mixture of the hydrophilic copolymer (A) and the plasticizing component (F) was obtained using the aqueous dispersion liquid in the same manner as in Production Example 1.

Production Example 3: Synthesis of Hydrophilic Copolymer (A)-Containing Mixture Comprising Plasticizer Component (F), for Use in Example 11

An aqueous dispersion liquid of the hydrophilic copolymer (A) was obtained in the same manner as in Production Example 1, and then a liquid obtained by mixing 10 parts by mass of liquid polybutadiene [LBR 352] and 5 parts by mass of a carboxyl group-modified product of a liquid acrylonitrile-butadiene copolymer (NBR), [DN-601: manufactured by Zeon Corporation], as the plasticizing agent component (F) each based on 100 parts by mass of the hydrophilic copolymer (A) contained in the aqueous dispersion liquid was added to the aqueous dispersion liquid, and the resultant mixture was dried at 80° C. under reduced pressure while being mixed to obtain a dried mixture of the hydrophilic copolymer (A) and the plasticizing component (F).

Production Example 4: Synthesis of Hydrophilic Copolymer (A)-Containing Mixture Comprising Compound (E) and Plasticizing Component (F), for Use in Example 12

An aqueous dispersion liquid of the hydrophilic copolymer (A) was obtained in the same manner as in Production Example 1, and then a liquid obtained by mixing 3 parts by mass of a nonionic surfactant [XL-100: manufactured by DKS Co., Ltd.] as at least one compound (E) selected from the group consisting of surfactants and (meth)acrylic acid ester monomers containing a polyalkylene glycol chain, and 10 parts by mass of liquid polybutadiene [LBR 352] and 5 parts by mass of a carboxyl group-modified product of a liquid acrylonitrile-butadiene copolymer (NBR), [DN-601: manufactured by Zeon Corporation], as the plasticizing agent component (F) each based on 100 parts by mass of the hydrophilic copolymer (A) contained in the aqueous dispersion liquid was added to the aqueous dispersion liquid, and the resultant mixture was dried at 80° C. under reduced pressure while being mixed to obtain a dried mixture of the hydrophilic copolymer (A), the compound (E), and the plasticizing component (F).

Production Example 5: Synthesis of Hydrophilic Copolymer (A)-Containing Mixture Comprising Compound (E) and Plasticizing Component (F), for Use in Example 13

An aqueous dispersion liquid of the hydrophilic copolymer (A) was obtained in the same manner as in Production Example 1, and then a liquid obtained by mixing 3 parts by mass of a nonionic surfactant [XL-100: manufactured by DKS Co., Ltd.] as at least one compound (E) selected from the group consisting of surfactants and (meth)acrylic acid ester monomers containing a polyalkylene glycol chain, and 10 parts by mass of liquid polybutadiene [LBR 352] and 5 parts by mass of a liquid carboxylic acid-modified acrylic polymer [CBB-3098: manufactured by Soken Chemical & Engineering Co., Ltd.] as the plasticizing agent component (F) each based on 100 parts by mass of the hydrophilic copolymer (A) contained in the aqueous dispersion liquid was added to the aqueous dispersion liquid, and the resultant mixture was dried at 80° C. under reduced pressure while being mixed to obtain a dried mixture of the hydrophilic copolymer (A), the compound (E), and the plasticizing component (F).

Production Example 6: Synthesis of Hydrophilic Copolymer (A) for Use in Example 14 and Comparative Example 3

An aqueous dispersion liquid of the hydrophilic copolymer (A) was obtained in the same manner as in Example 1 and then directly dried at 80° C. under reduced pressure without adding liquid polybutadiene to obtain a dried product of the hydrophilic copolymer (A).

Production Example 7: Preparation of Infrared Ablation Layer

A coating solution for forming an ablation layer was obtained by mixing 10 parts by mass of an ethylene-acrylic acid copolymer [SG-2000: manufactured by Namariichi Co., Ltd., 20% by mass aqueous solution] being an anionic polymer containing a carboxylic acid group as an anionic polar functional group, 5 parts by mass of carbon black [BONEJT CW-2: manufactured by ORIENT CHEMICAL INDUSTRIES CO., LTD., 20% by mass aqueous solution], 0.05 parts by mass of a mold release agent [KF-351: manufactured by Shin-Etsu Chemical Co., Ltd.], 30 parts by mass of water, and, 15 parts by mass of ethanol.

A PET film having a thickness of about 100 μm to be a cover film was coated with the coating solution for forming an ablation layer so that the film thickness after drying was 3 μm and was then subjected to drying treatment at 90° C. for 2 minutes to obtain a layered body of an ablation layer and a cover film.

Example 1

(1) Production of Photosensitive Resin Composition

With a pressurizing kneader, 110 parts by mass of the mixture comprising the hydrophilic copolymer (A) and the plasticizer component (F), the mixture obtained in Production Example 1, and 75 parts by mass of a styrene-butadiene-styrene copolymer [D-KX405: manufactured by Kraton Corporation] were mixed at 140° C., then a mixture of 120 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, 3 parts by mass of a surfactant [XL-100: manufactured by DKS Co., Ltd.], and 5 parts by mass of 2,6-di-t-butyl-p-cresol was added little by little over 15 minutes, and the resultant mixture was further kneaded for 20 minutes after the addition was completed to obtain a photosensitive resin composition.

(2) Production of Printing Original Plate

The composition was taken out and then sandwiched between a polyester film (hereinafter, abbreviated as PET) having a thickness of 100 μm coated with an elastomer-containing adhesive, and a PET having a thickness of 100 μm coated with a polyvinyl alcohol (PVA) layer having a thickness of 5 μm to be molded into a plate form having a thickness of 1.14 mm with a pressing machine heated to 120° C., and subsequently the PET coated with the PVA layer was peeled to obtain a layered body of support (PET)-photosensitive layer.

The infrared ablation layer comprising the cover film stacked thereon obtained in Production Example 7, was laminated on the obtained layered body so as to come into contact with the photosensitive layer to obtain a printing original plate.

(3) Production of Printing Plate

Exposure was performed from the side of the support (the PET coated with adhesive) of the printing original plate using an ultraviolet exposure machine (JE-A2-SS manufactured by Nihon Seiki Co., Ltd.) so that the pattern height (RD) after curing was approximately 0.6 mm.

Next, the cover film of the infrared ablation layer was peeled, drawing was then performed on the infrared ablation layer using a laser drawing machine (CDI) manufactured by Esko-Graphics bvba., and thereafter exposure was performed from the side of the infrared ablation layer with the exposure machine for 10 minutes.

After the exposure was completed, unexposed portion was removed through washing (development) at 40° C. with an aqueous solution (aqueous developing solution) containing 1% of Nissan soap using a washing machine (JOW-A3-P) manufactured by Nihon Denshi Seiki Co., Ltd. Here, a washing time was set as follows: the unexposed printing original plate was washed for 5 minutes and engraved thickness d (mm) was measured in advance, and then the time required to engrave the predetermined pattern height (RD=0.6 (mm)) was obtained by calculating RD×d/5×1.5 (minutes).

After drying, post-exposure was performed with an ultraviolet germicidal lamp or an ultraviolet chemical lamp to obtain a printing plate.

(4) Evaluation

(a) Evaluation of Dispersion State of Phase Comprising Hydrophilic Copolymer (A) in Photosensitive Resin Composition The photosensitive resin composition was held between two PET films on which a peeling treatment had been performed and was then molded at 120° C. with a pressing machine to obtain a sheet-like molded article having a thickness of 1 mm. Exposure was performed with an exposure value of 7500 mJ from both surfaces of the sheet-like molded article using a high-pressure mercury lamp of the ultraviolet exposure machine (JE-A2-SS manufactured by Nihon Seiki Co., Ltd.). It is to be noted that the exposure value of the high-pressure mercury lamp was a value measured at a wavelength of 365 nm.

Next, a small piece was cut out horizontally to the sheet from the central portion of the exposed molded article, and the piece was cut with a cryo-microtome to obtain a thin film section as a specimen for observation.

A 30-μm square in a cross-section of the thin film section was observed using a scanning probe microscope (SPM) of an atomic force microscope (AFM) [Dimension Icon] manufactured by Bruker Corporation. When the observation was conducted, a Tapping mode was selected, and a rectangular type cantilever with a length of 125 μm, a width of 40 μm, and a thickness of 4 μm made of Si was used. The cantilever is commercially available as NCHV from Bruker Corporation and has a spring constant of approximately 40 N/m.

Data processing was performed using data processing software Nanoscope Analysis Ver 1.40, accessory software of Dimension Icon. A phase image was displayed as shown in FIG. 1 to correct distortion of the whole image with Plane fit processing, and thereafter a bright region which was the phase comprising the hydrophilic copolymer (A) was made uniform through Flatten processing.

Figure 2:
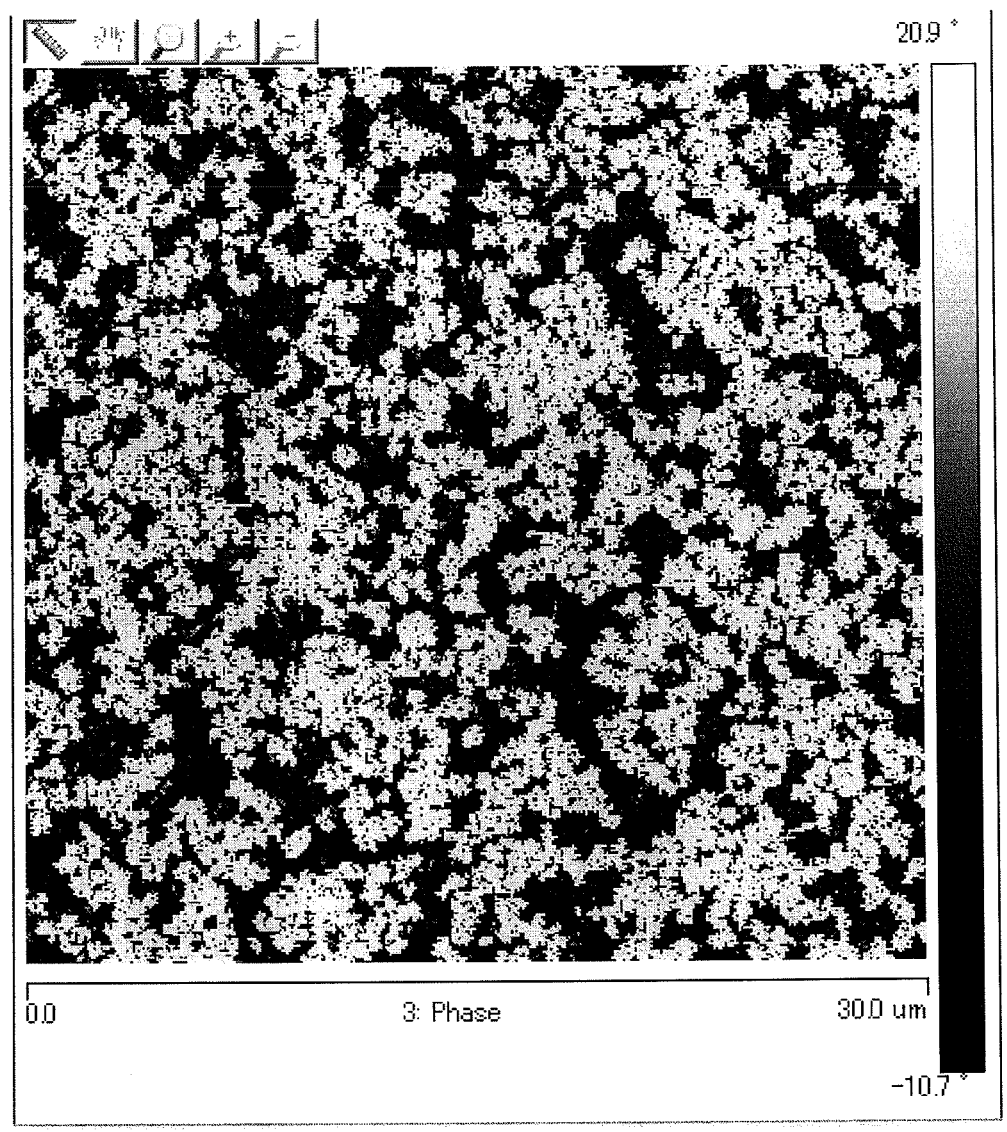
FIG. 2 is a figure obtained through image processing of the SPM image of FIG. 1 to separate a phase comprising a hydrophilic copolymer (A) from the other phase.

Next, image processing was performed with Particle Analysis by determining a threshold value while the image processing was visually confirmed so that an image of the phase comprising the hydrophilic copolymer (A) after the image processing (binarization) was substantially identical to the phase image before the image processing, thereby separating the phase comprising the hydrophilic copolymer (A) from the phase comprising the elastomer (B) as shown in FIG. 2 to determine the area percentage $S_A$ of the phase comprising the hydrophilic copolymer (A) in the 30-μm square. In addition, the phase area was measured for each phase comprising the hydrophilic copolymer (A) to make a histogram. The proportion (%) of the sum of each phase area of the phase having a phase area of 3 μm$^2$ or more and less than 100 μm$^2$ to the total area of the phase comprising the hydrophilic copolymer (A) was calculated based on this histogram.

(b) Evaluation of Cleanliness (Water Developability) of Printing Original Plate An aqueous solution containing 1% of Nissan soap was filled in a washing machine (JOW-A3-P) manufactured by Nihon Denshi Seiki Co., Ltd. to perform washing (development) at 40° C. for 5 minutes after the cover film of the infrared ablation layer of the printing original plate obtained in (2) was peeled.

The cleanliness was rated as ○ when the depth of the photosensitive layer engraved was 0.2 mm or more and rated as x when the depth of photosensitive layer engraved was 0.2 mm or less.

(c) Evaluation of Solvent Resistance of Printing Plate

As a solvent resistance test for evaluating the resistance of the printing plate against aqueous inks, the printing plate obtained in (3) was immersed experimentally in an aqueous solution containing 10% of isopropyl alcohol at 23° C. for 24 hours to measure the mass increase rate (water swelling rate).

The solvent resistance was rated as ○ when the mass increase rate was less than 2% and rated as x when the mass increase rate was 2% or more.

(d) Evaluation of Printing Durability of Printing Plate

An abrasion resistance test was performed using an abrasive wheel (Taber Abrasion Tester manufactured by TESTER SANGYO CO., LTD., hard abrasive wheel) experimentally in order to evaluate the strength of the plate surface of the printing plate (printing durability).

A printing plate whose whole surface was a solid print portion, was prepared in the same manner as in (2), and the obtained printing plate was immersed in an aqueous solution containing 10% of isopropyl alcohol as an alternative for an aqueous ink for 16 hours. Thereafter, the abrasion loss (mg/cm$^2$) at the plate surface after 1000 revolutions with the abrasive wheel was measured. It is to be noted that the abrasion loss was determined by dividing the amount of the mass of printing plate reduced (mg) by an area (cm$^2$) where the abrasive wheel was in contact with the solid print portion.

The abrasion resistance was rated as x when the abrasion loss was 10 mg/cm$^2$ or more and rated as ○ when the abrasion loss was less than that.

(e) Evaluation of Transparency (Haze) of Printing Original Plate

The photosensitive resin composition was held between two PET films having a thickness of 100 μm on which a release treatment had been performed and was then molded into a plate having a thickness of 3 mm with a pressing machine heated at 120° C.

The haze of the plate which was molded so as to have a thickness of 3 mm in an uncured state was measured with a Haze meter (NDH-5000) manufactured by NIPPON DENSHOKU INDUSTRIES CO., LTD. The transparency was rated as ○ when the haze was 20 or less, rated as Δ when the haze was more than 20 and less than 50, and rated as x when the haze was 50 or more.

(f) Evaluation of Image Reproducibility Before and after Moisture Absorption

Change in the width and depth of a 500 μm wide outlined line before and after moisture absorption were evaluated using the printing plate prepared in (3) (as a sample before moisture absorption) and a printing plate prepared in the same manner as in (3) except that the printing original plate was the one prepared in (2) and stored in a thermostatic chamber of 40° C. with a humidity of 80% for 1 week (as a sample after moisture absorption). The image reproducibility was rated as ○ when the difference in the line width and in the depth between before and after the moisture absorption were less than 5% and rated as Δ when the differences were 5% or more and less than 10%, and rated as x when the differences were 10% or more.

Examples 2-5, 7, 10

A photosensitive resin composition having a composition as shown in Table 1, and an original plate and a printing plate for flexographic printing each consisting of the photosensitive resin composition were obtained in the same manner as in Example 1 except that the amount of the elastomer (B), the polymerizable unsaturated monomer (C), and the compound (E), and the liquid polybutadiene added later were changed.

Evaluation results of the obtained photosensitive resin composition, printing original plate, and printing plate are shown in Table 2.

Examples 6, 8

A photosensitive resin composition having a composition as shown in Table 1, and an original plate and a printing plate for flexographic printing each consisting of the photosensitive resin composition were obtained in the same manner as in Example 1 except that the amount of the polymerizable unsaturated monomer (C) and the compound (E), and the plasticizer component (F) (liquid polybutadiene) mixed later were changed, and polyethylene glycol dimethacrylate (14G, manufactured by Shin Nakamura Chemical Co., Ltd.) was used as the compound (E).

Evaluation results of the obtained photosensitive resin composition, printing original plate, and printing plate are shown in Table 2.

Example 9

A photosensitive resin composition, and flexographic printing original plate and printing plate each comprising the photosensitive resin composition were obtained in the same manner as in Example 1 except that the mixture comprising the hydrophilic copolymer (A) and the plasticizer component (F) obtained in Production Example 2, was used in place of the mixture obtained in Production Example 1.

Evaluation results of the obtained photosensitive resin composition, printing original plate, and printing plate are shown in Table 2.

Example 11

With a pressurizing kneader, 115 parts by mass of the mixture comprising the hydrophilic copolymer (A) and the plasticizer component (F) obtained in Production Example 3, and 100 parts by mass of a styrene-butadiene-styrene copolymer [D-KX405: manufactured by Kraton Corporation] were mixed at 140° C., and then a mixture of 90 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, 3 parts by mass of a surfactant [XL-100: manufactured by DKS Co., Ltd.], and 5 parts by mass of 2,6-di-t-butyl-p-cresol was directly added little by little over 15 minutes, and the resultant mixture was further kneaded for 20 minutes after the addition was completed to obtain a photosensitive resin composition.

An original plate and a printing plate for flexographic printing were obtained using the photosensitive resin composition in the same manner as in Example 1.

Example 12

With a pressurizing kneader, 118 parts by mass of the mixture comprising the hydrophilic copolymer (A) and the plasticizer component (F) obtained in Production Example 4, and 100 parts by mass of a styrene-butadiene-styrene copolymer [D-KX405: manufactured by Kraton Corporation] were mixed at 140° C., and then a mixture of 90 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, and 5 parts by mass of 2,6-di-t-butyl-p-cresol was directly added little by little over 15 minutes, and the resultant mixture was further kneaded for 20 minutes after the addition was completed to obtain a photosensitive resin composition.

An original plate and a printing plate for flexographic printing were obtained using the photosensitive resin composition in the same manner as in Example 1.

Example 13

With a pressurizing kneader, 118 parts by mass of the mixture comprising the hydrophilic copolymer (A) and the plasticizer component (F), obtained in Production Example 5, and 100 parts by mass of a styrene-butadiene-styrene copolymer [D-KX405: manufactured by Kraton Corporation] were mixed at 140° C., and then a mixture of 90 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, and 5 parts by mass of 2,6-di-t-butyl-p-cresol was directly added little by little over 15 minutes, and the resultant mixture was further kneaded for 20 minutes after the addition was completed to obtain a photosensitive resin composition.

An original plate and a printing plate for flexographic printing were obtained using the photosensitive resin composition in the same manner as in Example 1.

Example 14

Into a pressurizing kneader, 100 parts by mass of the dried product of the hydrophilic copolymer (A) obtained in Production Example 6, and a mixture of 75 parts by mass of a styrene-butadiene-styrene copolymer [D-KX405: manufactured by Kraton Corporation], 75 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, 3 parts by mass of a surfactant [XL-100: manufactured by DKS Co., Ltd.], and 5 parts by mass of 2,6-di-t-butyl-p-cresol were added simultaneously, and the resultant mixture was kneaded for 300 minutes to obtain a photosensitive resin composition.

An original plate and a printing plate for flexographic printing were obtained using the photosensitive resin composition in the same manner as in Example 1.

Evaluation results of the obtained photosensitive resin composition, printing original plate, and printing plate are shown in Table 2.

Comparative Example 1

With a pressurizing kneader, 110 parts by mass of the dried product of the aqueous dispersion liquid of the hydrophilic copolymer (A) obtained in Production Example 1 and 20 parts by mass of a styrene-butadiene-styrene copolymer [D-KX405: manufactured by Kraton Corporation] were mixed at 140° C., and then a mixture of 60 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, 3 parts by mass of a surfactant [XL-100: manufactured by DKS Co., Ltd.], and 5 parts by mass of 2,6-di-t-butyl-p-cresol was added little by little over 15 minutes, and the resultant mixture was further kneaded for 20 minutes after the addition was completed to obtain a photosensitive resin composition.

An original plate and a printing plate for flexographic printing were obtained using the photosensitive resin composition in the same manner as in Example 1.

Evaluation results of the obtained photosensitive resin composition, printing original plate, and printing plate are shown in Table 2.

Figure 3:
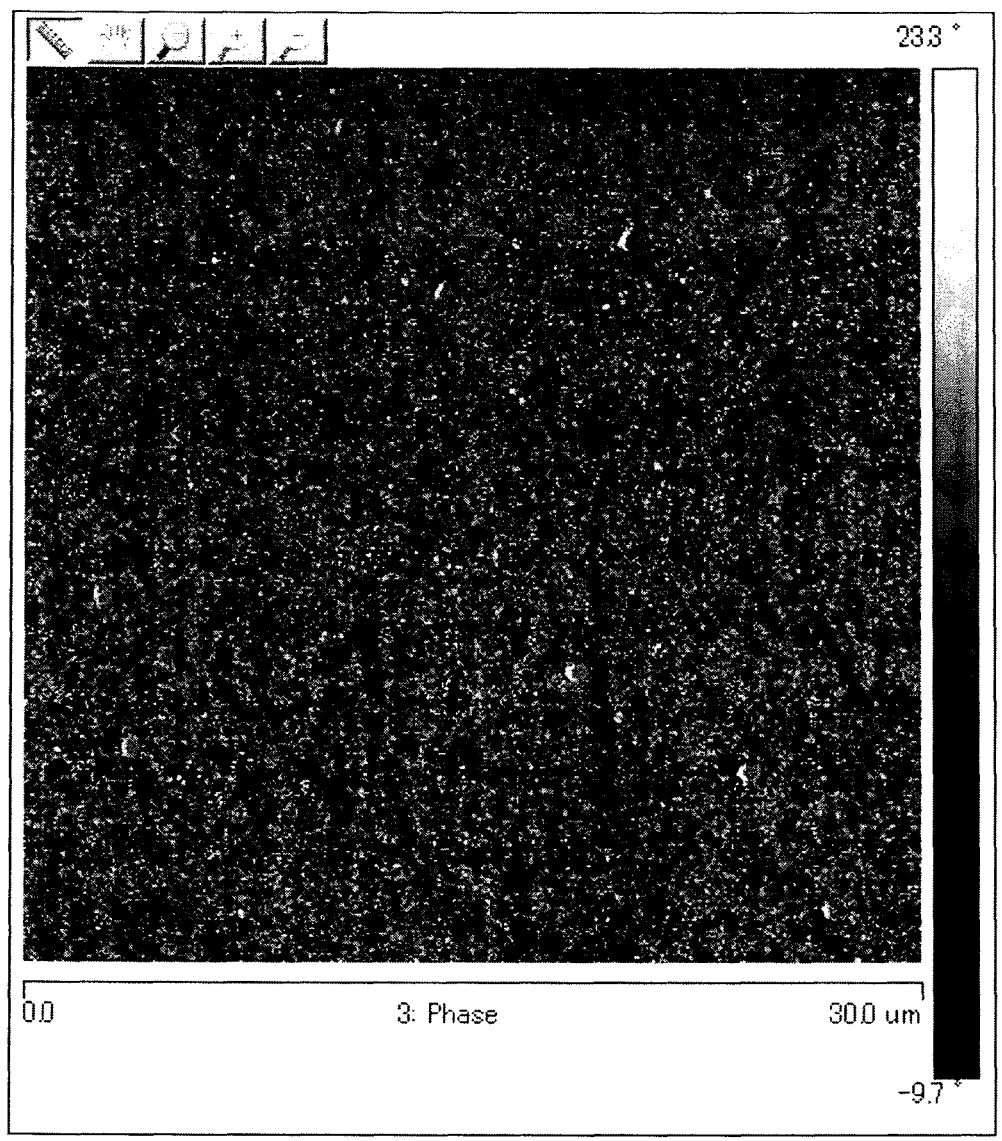
FIG. 3 is an SPM image of a cross-section of a cured product of a photosensitive resin composition for flexographic printing of Comparative Example 1.

In addition, an SPM image of a cross-section of the cured product of the photosensitive resin composition of Comparative Example 1 is shown in FIG. 3. In Comparative Example 1, the area percentage of the phase comprising the hydrophilic copolymer (A) was large, and many of the phases comprising the hydrophilic copolymer (A) had an area of 100 $\mu m^2$ or more.

Comparative Example 2

An original plate and a printing plate for flexographic printing were obtained in the same manner as in Comparative Example 1 except that the amount of the elastomer (B) (styrene-butadiene-styrene copolymer) and liquid butadiene added were changed as shown in Table 1.

Evaluation results of the obtained photosensitive resin composition, printing original plate, and printing plate are shown in Table 2. In Comparative Example 2., the area percentage itself of the phase comprising the hydrophilic copolymer (A) was small, and many of the phases comprising the hydrophilic copolymer (A) had an area of less than 3 $\mu m^2$.

Comparative Example 3

Into a pressurizing kneader, 100 parts by mass of the dried product of the hydrophilic copolymer (A) obtained in Production Example 6 and a mixture of 75 parts by mass of a styrene-butadiene-styrene copolymer [D-KX405: manufactured by Kraton Corporation], 75 parts by mass of liquid polybutadiene [LBR-352: manufactured by KURARAY CO., LTD.], 20 parts by mass of 1,9-nonanediol diacrylate, 20 parts by mass of 1,6-hexanediol dimethacrylate, 5 parts by mass of 2,2-dimethoxyphenylacetophenone, 3 parts by mass of a surfactant [XL-100: manufactured by DKS Co., Ltd.], and 5 parts by mass of 2,6-di-t-butyl-p-cresol were added simultaneously, and the resultant mixture was kneaded for 30 minutes to obtain a photosensitive resin composition.

An original plate and a printing plate each for flexographic printing were obtained using the photosensitive resin composition in the same manner as in Example 1.

Evaluation results of the obtained photosensitive resin composition, printing original plate, and printing plate are shown in Table 2.

Figure 4:
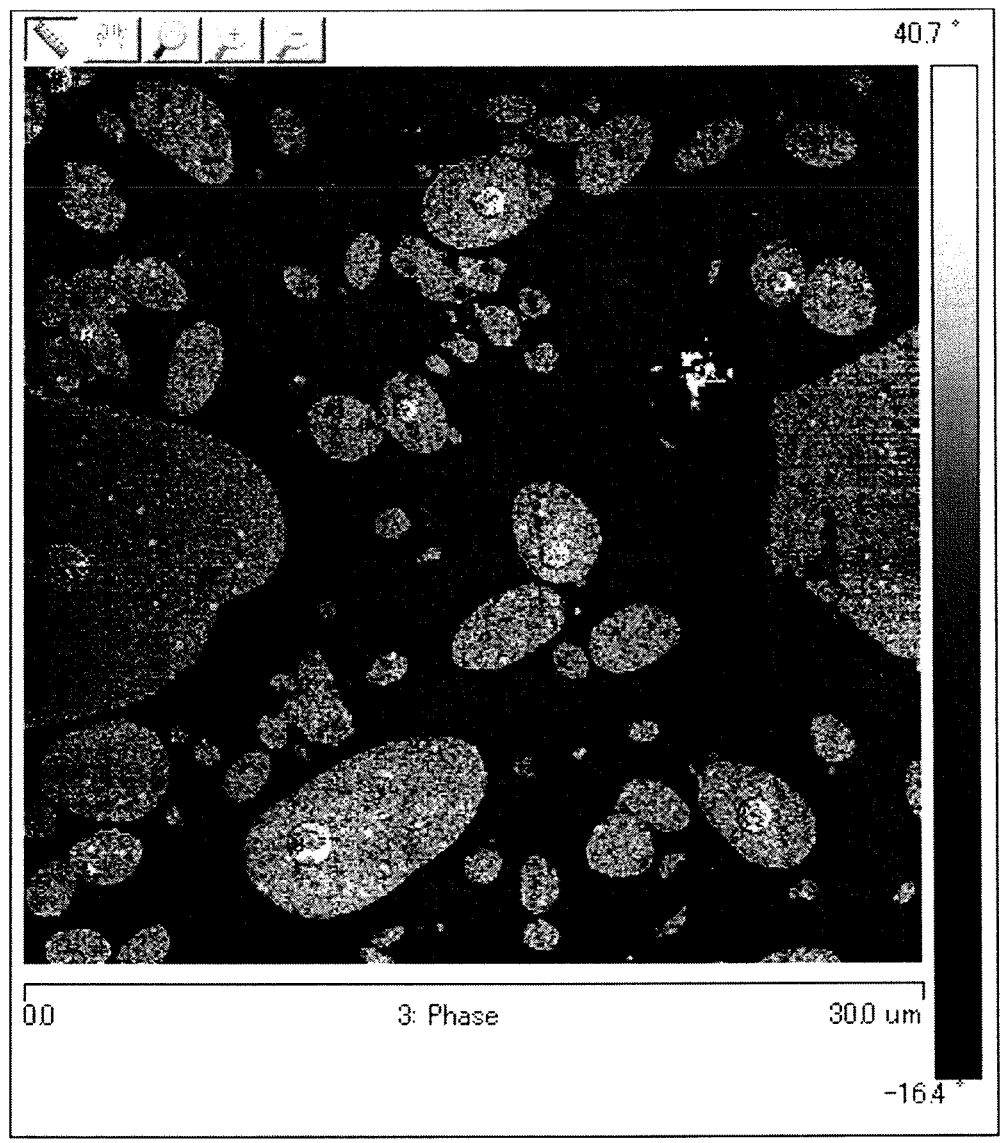
FIG. 4 is an SPM image of a cross-section of a cured product of a photosensitive resin composition for flexographic printing of Comparative Example 3.

In addition, an SPM image of a cross-section of the cured product of the photosensitive resin composition of Comparative Example 3 is shown in FIG. 4. In Comparative Example 3, many of the phases comprising the hydrophilic copolymer (A) had an area of 100 $\mu m^2$ or more.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Hydrophilic copolymer (A)-containing mixture comprising plasticizer component (F) | Production Example 1 | 110 | 110 | 110 | 110 | 110 | 110 | 110 | 110 | |
| | Production Example 2 | | | | | | | | | |
| | Production Example 3 | | | | | | | | | 110 |
| Hydrophilic copolymer (A)-containing mixture comprising compound (D) and plasticizer component (F) | Production Example 4 | | | | | | | | | |
| | Production Example 5 | | | | | | | | | |
| Hydrophilic copolymer (A) | Production Example 6 | | | | | | | | | |
| Elastomer (B) | Styrene-butadiene-styrene copolymer (D-KX-405) | 75 | 100 | 150 | 75 | 75 | 75 | 75 | 75 | 75 |
| Polymerizable unsaturated monomer (C) | 1,6-Hexanediol dimethacrylate | 20 | 20 | 20 | 20 | 20 | 0 | 30 | 20 | 20 |
| | 1,9-Nonanediol diacrylate | 20 | 20 | 20 | 20 | 20 | 20 | 30 | 20 | 20 |
| Photopolymerization initiator (D) | 2,2-dimethoxyphenylacetophenone | 5 | 5 | 5 | 5 | 5 | 5 | 5 | 5 | 5 |
| Compound (E) surfactant | Nonionic surfactant (XL-100) | 3 | 3 | 3 | 9 | 1 | | 3 | | 3 |
| Compound (E) (meth)acrylic acid ester monomer containing a polyalkylene glycol chain | Polyethylene glycol dimethacrylate (14G) | | | | | | | 9 | 3 | |
| Plasticizer component (F) mixed later | Liquid polybutadiene (LBR-352) | 120 | 90 | 190 | 65 | 90 | 120 | 90 | 90 | 90 |
| Stabilizer | 2,6-di-t-butyl-p-cresol | 5 | 7 | 10 | 5 | 5 | 5 | 5 | 5 | 5 |

| | | Example 10 | Example 11 | Example 12 | Example 13 | Example 14 | Comparative Example 1 | Comparative Example 2 | Comparative Example 3 |
|---|---|---|---|---|---|---|---|---|---|
| Hydrophilic copolymer (A)-containing mixture comprising plasticizer component (F) | Production Example 1 | 110 | | | | | 110 | 110 | |
| | Production Example 2 | | | | | | | | |
| | Production Example 3 | | 115 | | | | | | |
| Hydrophilic copolymer (A)-containing mixture comprising compound (D) and plasticizer component (F) | Production Example 4 | | | 118 | | | | | |
| | Production Example 5 | | | | 118 | | | | |
| Hydrophilic copolymer (A) | Production Example 6 | | | | | 100 | | | 100 |
| Elastomer (B) | Styrene-butadiene-styrene copolymer (D-KX-405) | 75 | 100 | 100 | 100 | 75 | 20 | 300 | 75 |
| Polymerizable unsaturated monomer (C) | 1,6-Hexanediol dimethacrylate | 20 | 20 | 20 | 20 | 20 | 20 | 20 | 20 |
| | 1,9-Nonanediol diacrylate | 20 | 20 | 20 | 20 | 20 | 20 | 20 | 20 |
| Photopolymerization initiator (D) | 2,2-dimethoxyphenylacetophenone | 5 | 5 | 5 | 5 | 5 | 5 | 5 | 5 |
| Compound (E) surfactant | Nonionic surfactant (XL-100) | 3 | 3 | | | 20 | 3 | 3 | 3 |
| Compound (E) (meth)acrylic acid ester monomer containing a polyalkylene glycol chain | Polyethylene glycol dimethacrylate (14G) | | | | | | | | |
| Plasticizer component (F) mixed later | Liquid polybutadiene (LBR-352) | 65 | 90 | 90 | 90 | 75 | 60 | 290 | 75 |
| Stabilizer | 2,6-di-t-butyl-p-cresol | 5 | 5 | 5 | 5 | 5 | 5 | 5 | 5 |

TABLE 2

| | | Example 1 | Example 2 | Example 3 | Example 4 | Example 5 | Example 6 | Example 7 | Example 8 | Example 9 |
|---|---|---|---|---|---|---|---|---|---|---|
| Proportion of phase comprising (A), $S_A$ | (%) | 40 | 35 | 32 | 46 | 39 | 42 | 48 | 39 | 37 |
| Proportion of phase of 3 μm² or more and less than 100 μm² in phase comprising (A) | (%) | 64 | 71 | 58 | 72 | 68 | 60 | 74 | 65 | 69 |
| WA of hydrophilic copolymer (A) | (%) | 28 | 28 | 20 | 32 | 31 | 29 | 29 | 30 | 30 |
| $S_A/W_A$ | | 1.43 | 1.24 | 1.63 | 1.42 | 1.27 | 1.44 | 1.67 | 1.28 | 1.21 |
| Cleanliness | | ○ | Δ | ○ | ○ | Δ | ○ | ○ | Δ | Δ |
| Image reproducibility before and after moisture absorption | | ○ | ○ | Δ | Δ | ○ | ○ | ○ | ○ | ○ |
| Haze | | ○ | ○ | Δ | Δ | ○ | Δ | ○ | ○ | ○ |
| Water swelling rate | | ○ | ○ | Δ | Δ | ○ | Δ | ○ | ○ | ○ |
| Printing durability after adhesion of aqueous ink | | ○ | ○ | ○ | ○ | ○ | ○ | ○ | ○ | ○ |

| | | Example 10 | Example 11 | Example 12 | Example 13 | Example 14 | Comparative Example 1 | Comparative Example 2 | Comparative Example 3 |
|---|---|---|---|---|---|---|---|---|---|
| Proportion of phase comprising (A), $S_A$ | (%) | 48 | 42 | 47 | 48 | 48 | 78 | 14 | 37 |
| Proportion of phase of 3 μm² or more and less than 100 μm² in phase comprising (A) | (%) | 50 | 60 | 74 | 78 | 49 | 0 | 12 | 3 |
| WA of hydrophilic copolymer (A) | (%) | 33 | 28 | 28 | 28 | 31 | 41 | 13 | 33 |
| $S_A/W_A$ | | 1.45 | 1.50 | 1.68 | 1.72 | 1.54 | 1.90 | 1.05 | 1.12 |
| Cleanliness | | ○ | ○ | ○ | ○ | ○ | ○ | X | X |
| Image reproducibility before and after moisture absorption | | Δ | ○ | ○ | ○ | Δ | X | ○ | X |
| Haze | | Δ | ○ | ○ | ○ | Δ | ○ | ○ | ○ |
| Water swelling rate | | Δ | ○ | ○ | ○ | Δ | X | ○ | X |
| Printing durability after adhesion of aqueous ink | | ○ | ○ | ○ | ○ | ○ | X | ○ | X |

INDUSTRIAL APPLICABILITY

The resin composition for flexographic printing according to the present invention can be used suitably as a material for a photosensitive layer of a flexographic printing original plate, among others, flexographic printing original plate for aqueous development.

The present application claims priority based on the Japanese Patent Application (Japanese Patent Application No. 2015-194669) filed with the Japan Patent Office on Sep. 30, 2015, the contents of which are hereby incorporated with reference.

The invention claimed is:

1. A photosensitive resin composition for flexographic printing, comprising: at least
   (A) a hydrophilic copolymer;
   (B) an elastomer;
   (C) a polymerizable unsaturated monomer; and
   (D) a photopolymerization initiator, wherein
   a proportion (area percentage) of a phase comprising the hydrophilic copolymer (A) in a cross-section of a cured product of the resin composition, $S_A$, is 15% or more and less than 60%, and
   a proportion of a phase having a phase area of 3 μm² or more and less than 100 μm² in the phase comprising the hydrophilic copolymer (A) in the cross-section is 20 (% by area) or more.

2. The photosensitive resin composition for flexographic printing according to claim 1, wherein a ratio of the $S_A$ (% by area) to a mass proportion of the hydrophilic copolymer (A) in the resin composition, $W_A$ (% by mass), $S_A/W_A$, is 1.35 or more.

3. The photosensitive resin composition for flexographic printing according to claim 1, comprising from 50 to 250 parts by mass of the elastomer (B), from 10 to 200 parts by mass of the polymerizable unsaturated monomer (C), and from 0.1 to 50 parts by mass of the photopolymerization initiator (D) each based on 100 parts by mass of the hydrophilic copolymer (A).

4. The photosensitive resin composition for flexographic printing according to claim 1, further comprising from 0.1 to 15 parts by mass of at least one compound (E) selected from a group consisting of surfactants and (meth)acrylic acid ester monomers containing a polyalkylene glycol chain.

5. The photosensitive resin composition for flexographic printing according to claim 1, further comprising from 1 to 250 parts by mass of a plasticizer component (F) based on 100 parts by mass of the hydrophilic copolymer (A).

6. The photosensitive resin composition for flexographic printing according to claim 5, wherein the plasticizer component (F) comprises at least one terminal-modified product of liquid polybutadiene modified by an OH group and/or a carboxyl group.

7. The photosensitive resin composition for flexographic printing according to claim 1, wherein the polymerizable unsaturated monomer (C) is contained in the phase comprising at least the hydrophilic copolymer (A).

8. The photosensitive resin composition for flexographic printing according to claim 1, wherein the elastomer (B) is a thermoplastic block copolymer.

9. The photosensitive resin composition for flexographic printing according to claim 1, wherein the hydrophilic copolymer (A) is an internally crosslinked polymer particle comprising a unit derived from a reactive emulsifier containing an unsaturated double bond.

10. A method for producing the photosensitive resin composition for flexographic printing according to claim 1, the method comprising the following 1 to 3 in this order:
1. adding at least one compound (E) selected from a group consisting of surfactants and (meth)acrylic acid ester monomers containing a polyalkylene glycol chain and/or a plasticizer component (F) to a hydrophilic copolymer (A)-containing aqueous dispersion liquid;
2. removing water from the hydrophilic copolymer (A)-containing aqueous dispersion liquid; and
3. adding the elastomer (B), the polymerizable unsaturated monomer (C), and the photopolymerization initiator (D) to a mixture obtained in 2, the mixture comprising the hydrophilic copolymer (A), and then kneading a resultant mixture.

11. A flexographic printing original plate comprising a photosensitive layer comprising the photosensitive resin composition for flexographic printing according to claim 1.

* * * * *